(12) United States Patent
Kim et al.

(10) Patent No.: US 11,387,234 B2
(45) Date of Patent: Jul. 12, 2022

(54) SEMICONDUCTOR DEVICE

(71) Applicant: SAMSUNG ELECTRONICS CO., LTD., Suwon-si (KR)

(72) Inventors: Taehyung Kim, Hwaseong-si (KR); Panjae Park, Seongnam-si (KR); Jaeseok Yang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/910,385

(22) Filed: Jun. 24, 2020

(65) Prior Publication Data
US 2021/0193657 A1 Jun. 24, 2021

(30) Foreign Application Priority Data
Dec. 24, 2019 (KR) ........................ 10-2019-0174078

(51) Int. Cl.
| | |
|---|---|
| *H01L 27/092* | (2006.01) |
| *H01L 23/528* | (2006.01) |
| *H01L 29/10* | (2006.01) |
| *H01L 21/8238* | (2006.01) |
| *H01L 29/66* | (2006.01) |
| *H01L 29/78* | (2006.01) |

(52) U.S. Cl.
CPC .... *H01L 27/092* (2013.01); *H01L 21/823807* (2013.01); *H01L 21/823871* (2013.01); *H01L 21/823885* (2013.01); *H01L 23/5286* (2013.01); *H01L 29/1037* (2013.01); *H01L 29/66666* (2013.01); *H01L 29/7827* (2013.01)

(58) Field of Classification Search
CPC ..... H01L 21/823871; H01L 21/823885; H01L 27/0207; H01L 27/092; H01L 23/5286; H01L 29/7827; H01L 29/66666
See application file for complete search history.

(56) References Cited

U.S. PATENT DOCUMENTS

| | | | |
|---|---|---|---|
| 8,058,683 B2 | 11/2011 | Yoon et al. | |
| 9,236,300 B2 * | 1/2016 | Liaw | .................. H01L 27/0207 |
| 9,312,383 B1 | 4/2016 | Cheng et al. | |
| 9,397,094 B2 | 7/2016 | Cheng et al. | |
| 9,711,511 B1 | 7/2017 | Lim et al. | |

(Continued)

FOREIGN PATENT DOCUMENTS

KR    10-1398494 B1    5/2014

*Primary Examiner* — Michael M Trinh
(74) *Attorney, Agent, or Firm* — Lee IP Law, PC

(57) ABSTRACT

A semiconductor device includes a substrate with a first active region; first and second active patterns extending in a first direction and spaced apart in a second direction, and each having a source pattern, a channel pattern, and a drain pattern that are sequentially stacked; first and second gate electrodes that surround the channel patterns of the first and second active patterns and extend in the first direction; an interlayer dielectric layer that covers the first and second active patterns and the first and second gate electrodes; a first active contact that penetrates the interlayer dielectric layer and is coupled to the first active region between the first and second active patterns; and a first power rail on the interlayer dielectric layer and electrically connected to the first active contact, each of the first and second active patterns including an overlapping region that vertically overlaps the first power rail.

20 Claims, 29 Drawing Sheets

(56) References Cited

U.S. PATENT DOCUMENTS

| | | | |
|---|---|---|---|
| 10,062,752 B1* | 8/2018 | Leobandung | H01L 29/41741 |
| 10,083,871 B2 | 9/2018 | Cheng et al. | |
| 10,164,057 B1 | 12/2018 | Jeon et al. | |
| 10,312,349 B2 | 6/2019 | Mochizuki et al. | |
| 10,347,717 B2 | 7/2019 | Leobandung | |
| 2015/0194429 A1* | 7/2015 | Moroz | H01L 27/0207 |
| | | | 257/369 |
| 2016/0351689 A1* | 12/2016 | Cheng | H01L 21/823412 |
| 2018/0097111 A1* | 4/2018 | Zhu | H01L 21/823807 |
| 2018/0358347 A1* | 12/2018 | Jeong | H01L 27/0924 |
| 2020/0144417 A1* | 5/2020 | Do | H01L 29/42356 |
| 2020/0403605 A1* | 12/2020 | Date | H03K 3/35625 |

\* cited by examiner

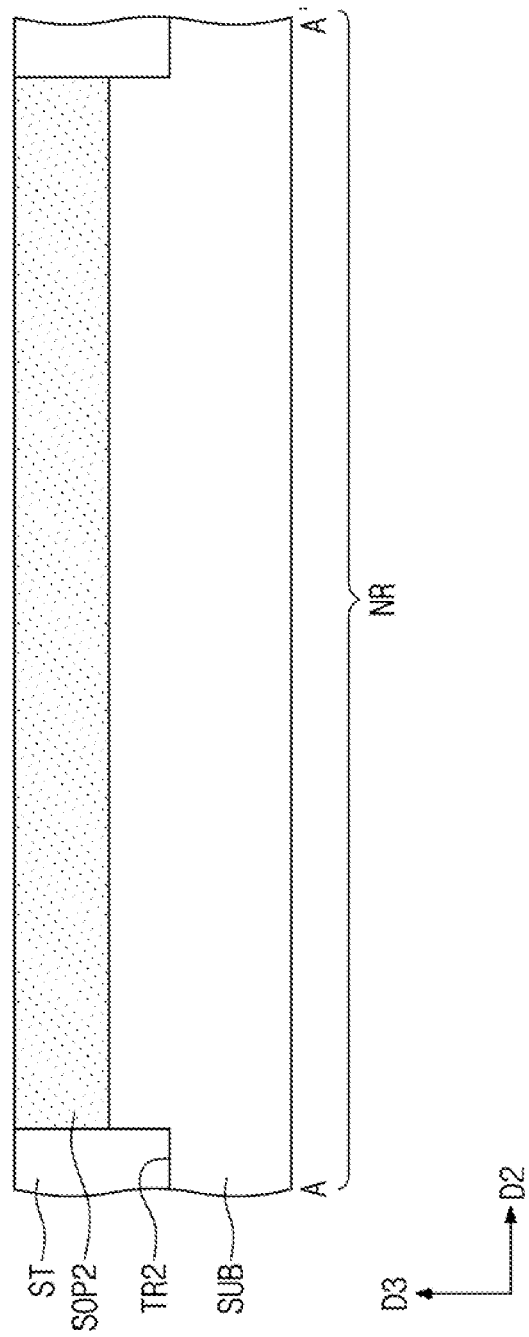

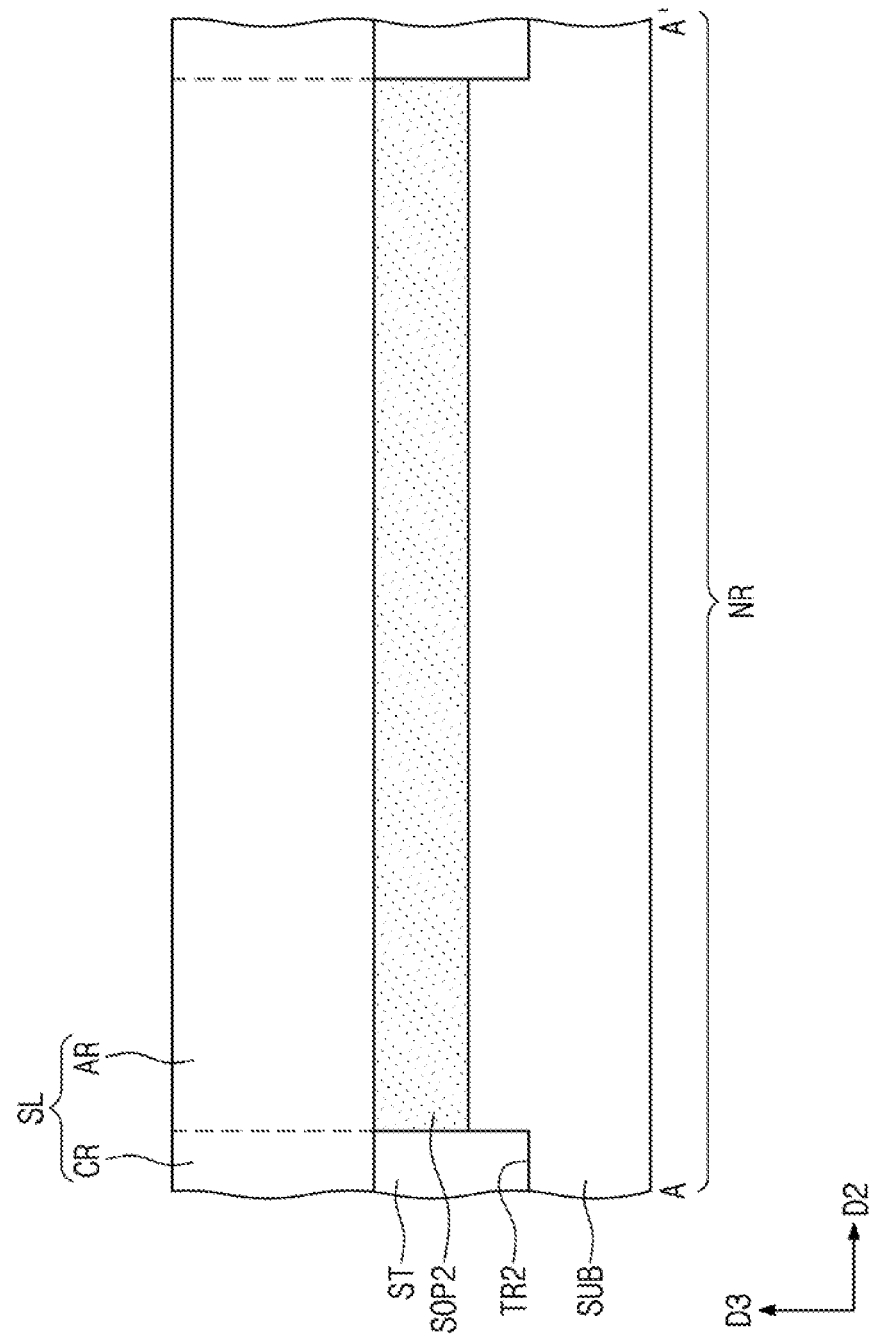

SEMICONDUCTOR DEVICE

CROSS-REFERENCE TO RELATED APPLICATION

Korean Patent Application No. 10-2019-0174078, filed on Dec. 24, 2019, in the Korean Intellectual Property Office, and entitled: "Semiconductor Device," is incorporated by reference herein in its entirety.

BACKGROUND

1. Field

Embodiments relate to a semiconductor device.

2. Description of the Related Art

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices are gradually complicated and integrated to meet these requested characteristics.

SUMMARY

Embodiments are directed to a semiconductor device, including a substrate that includes a first active region; a first active pattern and a second active pattern that are on the first active region, the first and second active patterns extending in a first direction and being spaced apart from each other in a second direction that intersects the first direction, and each of the first and second active patterns having a source pattern, a channel pattern, and a drain pattern that are sequentially stacked; a first gate electrode and a second gate electrode that surround the channel patterns of the first and second active patterns and extend in the first direction; an interlayer dielectric layer that covers the first and second active patterns and the first and second gate electrodes; a first active contact that penetrates the interlayer dielectric layer and is coupled to the first active region between the first and second active patterns; and a first power rail on the interlayer dielectric layer and electrically connected to the first active contact, each of the first and second active patterns including an overlapping region that vertically overlaps the first power rail.

Embodiments are directed to a semiconductor device, including: a substrate that includes a first active region; a first active pattern and a second active pattern that are on the first active region, the first and second active patterns extending in a first direction and being spaced apart from each other in a second direction that intersects the first direction, and the first and second active patterns protruding in a vertical direction from a top surface of the substrate; a first gate electrode and a second gate electrode that surround the first and second active patterns and extend in the first direction, upper portions of the first and second active patterns protruding in the vertical direction above top surfaces of the first and second gate electrodes; an interlayer dielectric layer that covers the first and second active patterns and the first and second gate electrodes; a first active contact that penetrates the interlayer dielectric layer and is coupled to the first active region between the first and second active patterns; and a first power rail on the interlayer dielectric layer and electrically connected to the first active contact, wherein, in plan view, the first power rail runs across the first and second active patterns and extends in the second direction.

Embodiments are directed to a semiconductor device, including: a first power rail, a second power rail, and a third power rail that are arranged along a first direction on a substrate; and a logic cell between the first power rail and the third power rail, the logic cell including: a first active region adjacent to the first power rail, a second active region across which the second power rail runs, and a third active region adjacent to the third power rail; first to third active patterns respectively on the first to third active regions, when viewed in plan, each of the first to third active patterns having a bar shape that extends in the first direction; and a gate electrode on the first to third active patterns. Each of the first to third active patterns may vertically extend from the substrate and penetrate the gate electrode, the first active pattern may have a first length in the first direction, the second active pattern may have a second length in the first direction, and the second length may be two to five times the first length.

BRIEF DESCRIPTION OF THE DRAWINGS

Features will become apparent to those of skill in the art by describing in detail example embodiments with reference to the attached drawings in which:

FIGS. 8A, 10A, 12A, 14A, 16A, and 18A illustrate cross-sectional views taken along line A-A' of FIGS. 7, 9, 11, 13, 15, and 17, respectively.

DETAILED DESCRIPTION

Figure 1:
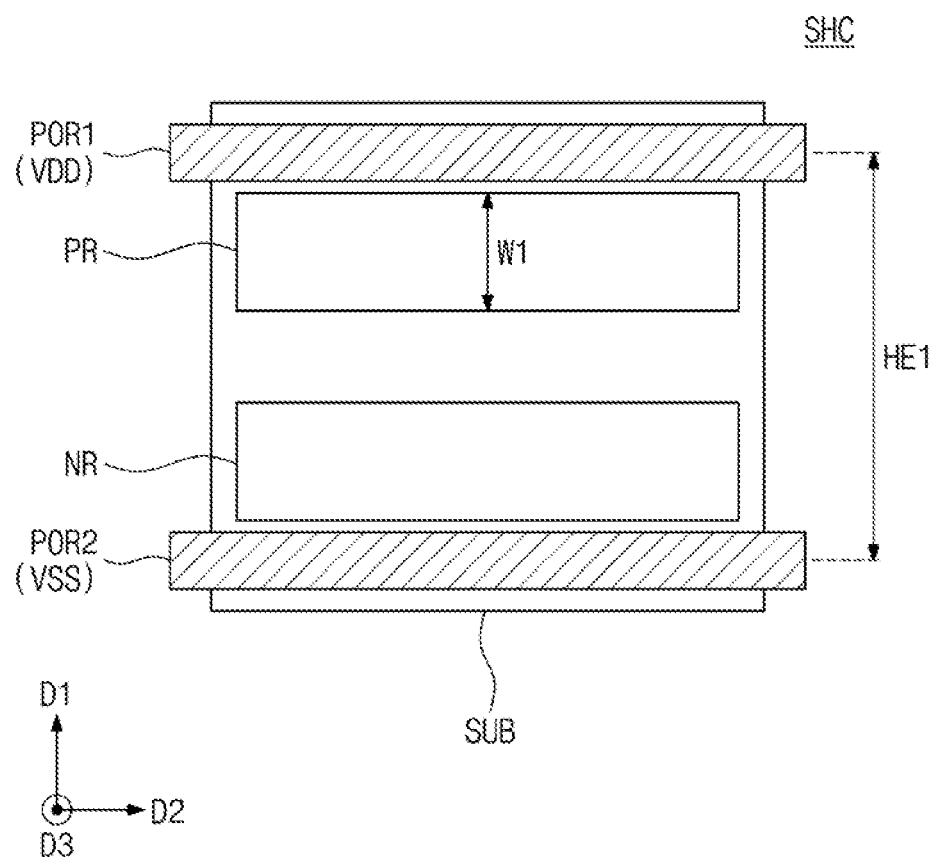
FIGS. 1, 2, and 3 illustrate conceptual plan views showing logic cells of a semiconductor device according to an example embodiment.
Figure 2:
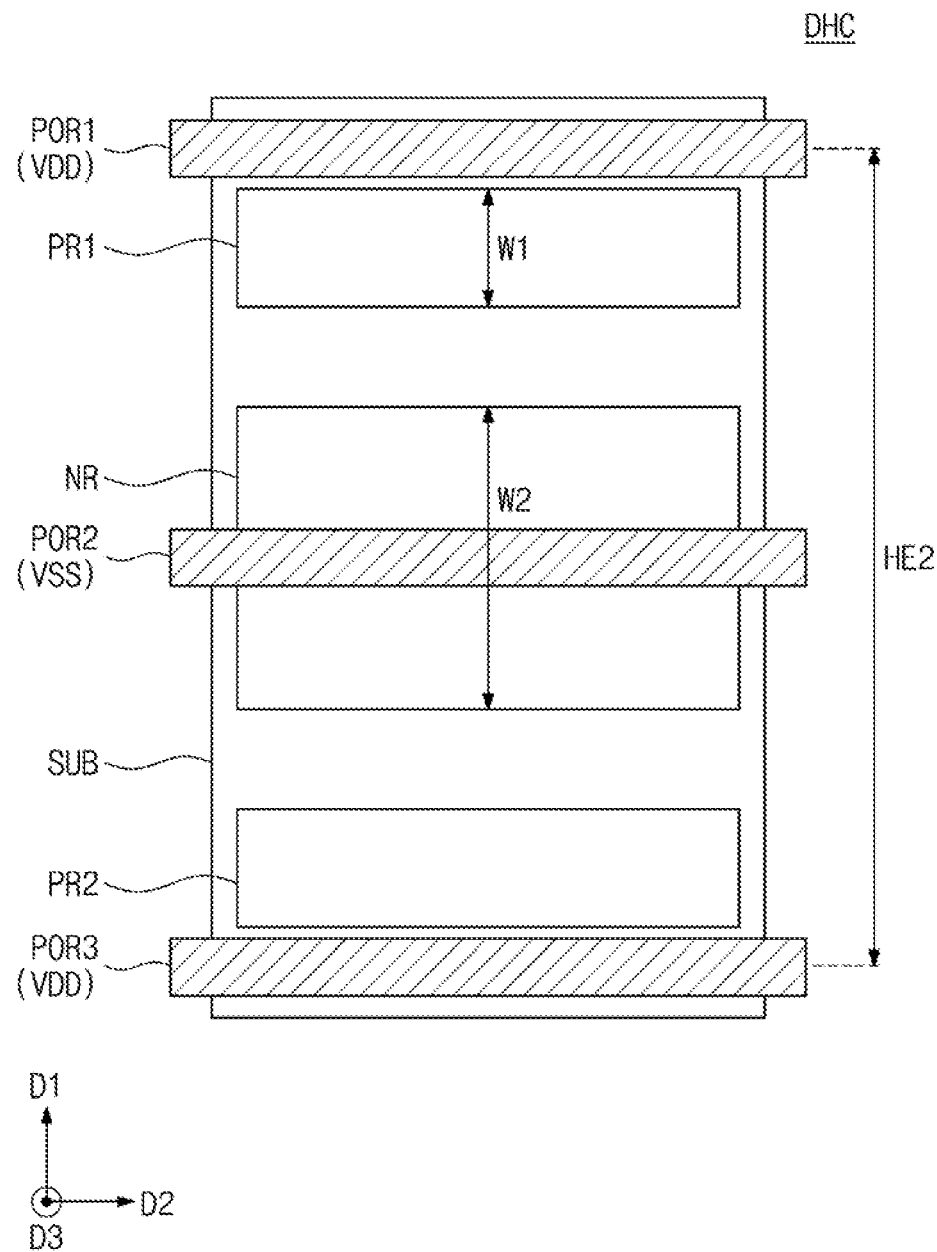
Figure 3:
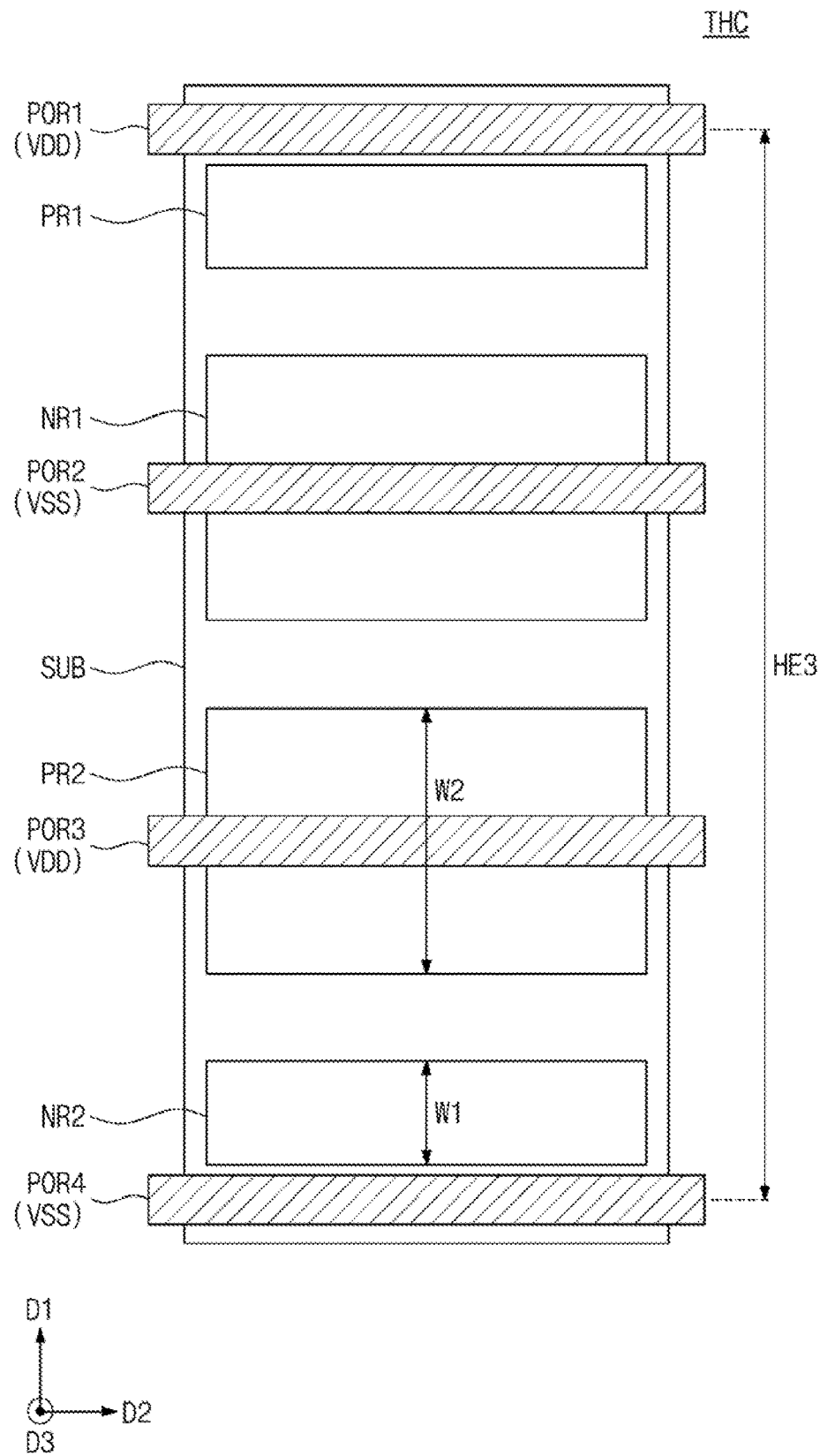

FIGS. 1, 2, and 3 illustrate conceptual plan views showing logic cells of a semiconductor device according to an example embodiment.

Referring to FIG. 1, a single height cell SHC may be provided, where the height refers to a length in a first horizontal direction D1 of the single height cell SHC. For example, a first power rail POR1 and a second power rail POR2 may be provided on a substrate SUB. The first power rail POR1 may be a pathway or conductor to which is provided a drain voltage VDD, for example, a power voltage. The second power rail POR2 may be a pathway or conductor to which is provided a source voltage VSS, for example, a ground voltage.

The single height cell SHC may be defined between the first power rail POR1 and the second power rail POR2. The single height cell SHC may include one PMOSFET region PR and one NMOSFET region NR. For example, the single height cell SHC may have a CMOS structure provided between the first power rail POR1 and the second power rail POR2.

Each of the PMOSFET and NMOSFET regions PR and NR may have a first width W1 in the first direction D1, which may be a first horizontal direction. A first height HE1 may be defined to indicate a length in the first direction D1 of the single height cell SHC. The first height HE1 may be substantially the same as a distance (e.g., pitch) between the first power rail POR1 and the second power rail POR2.

The single height cell SHC may constitute one logic cell. The logic cell may be a logic device (e.g., inverter or flip-flop) that performs a specific function. For example, the logic cell may include transistors that constitute the logic device, and may also include wiring lines that connect the transistors to each other.

Referring to FIG. 2, a double height cell DHC may be provided. For example, a first power rail POR1, a second power rail POR2, and a third power rail POR3 may be provided on a substrate SUB. The first to third power rails POR1 to POR3 may be sequentially arranged in the first direction D1. The third power rail POR3 may be a pathway or conductor to which a drain voltage VDD is provided.

The double height cell DHC may be defined between the first power rail POR1 and the third power rail POR3. The double height cell DHC may include a first PMOSFET region PR1, an NMOSFET region NR, and a second PMOSFET region PR2. The first PMOSFET region PR1 may be adjacent to the first power rail POR1, and the second PMOSFET region PR2 may be adjacent to the third power rail POR3. The NMOSFET region NR may overlap the second power rail POR2.

Each of the first and second PMOSFET regions PR1 and PR2 may have a first width W1 in the first direction D1. The NMOSFET region NR may have a second width W2 in the first direction D1. The second width W2 may be two to three times the first width W1. A second height HE2 may be defined to indicate a length in the first direction D1 of the double height cell DHC. The second height HE2 may be about twice the first height HE1 of FIG. 1.

The NMOSFET region NR of the double height cell DHC may be larger than the NMOSFET region NR of the single height cell SHC discussed above in FIG. 1 (e.g., W2>W1). Therefore, a transistor provided on the NMOSFET region NR of the double height cell DHC may have a channel whose size is greater than that of a channel of a transistor provided on the NMOSFET region NR of the single height cell SHC. As a result, the double height cell DHC may improve electrical characteristics of a semiconductor device.

In an example embodiment, the first and second PMOSFET regions PR1 and PR2 may both include PMOS transistors that constitute a logic device or cell. In other example embodiments, one of the first and second PMOSFET regions PR1 and PR2 may be a dummy region that does not constitute the logic device.

Referring to FIG. 3, a triple height cell THC may be provided. For example, a first power rail POR1, a second power rail POR2, a third power rail POR3, and a fourth power rail POR4 may be provided on a substrate SUB. The first to fourth power rails POR1 to POR4 may be sequentially arranged in the first direction D1. The fourth power rail POR4 may be a pathway to which a source voltage VSS is provided.

The triple height cell THC may be defined between the first power rail POR1 and the fourth power rail POR4. The triple height cell THC may include a first PMOSFET region PR1, a first NMOSFET region NR1, a second PMOSFET region PR2, and a second NMOSFET region NR2. The first PMOSFET region PR1 may be adjacent to the first power rail POR1, and the second NMOSFET region NR2 may be adjacent to the fourth power rail POR4. The first NMOSFET region NR1 may be adjacent to the second power rail POR2, and the second PMOSFET region PR2 may be adjacent to the third power rail POR3.

Each of the first PMOSFET region PR1 and the second NMOSFET region NR2 may have a first width W1 in a first direction D1. Each of the first NMOSFET region NR1 and the second PMOSFET region PR2 may have a second width W2 in the first direction D1. A third height HE3 may be defined to indicate a length in the first direction D1 of the triple height cell THC. The third height HE3 may be about twice the first height HE1 of FIG. 1.

A multi-height cell may to refer to the double height cell DHC of FIG. 2 and/or the triple height cell THC of FIG. 3.

Figure 4:
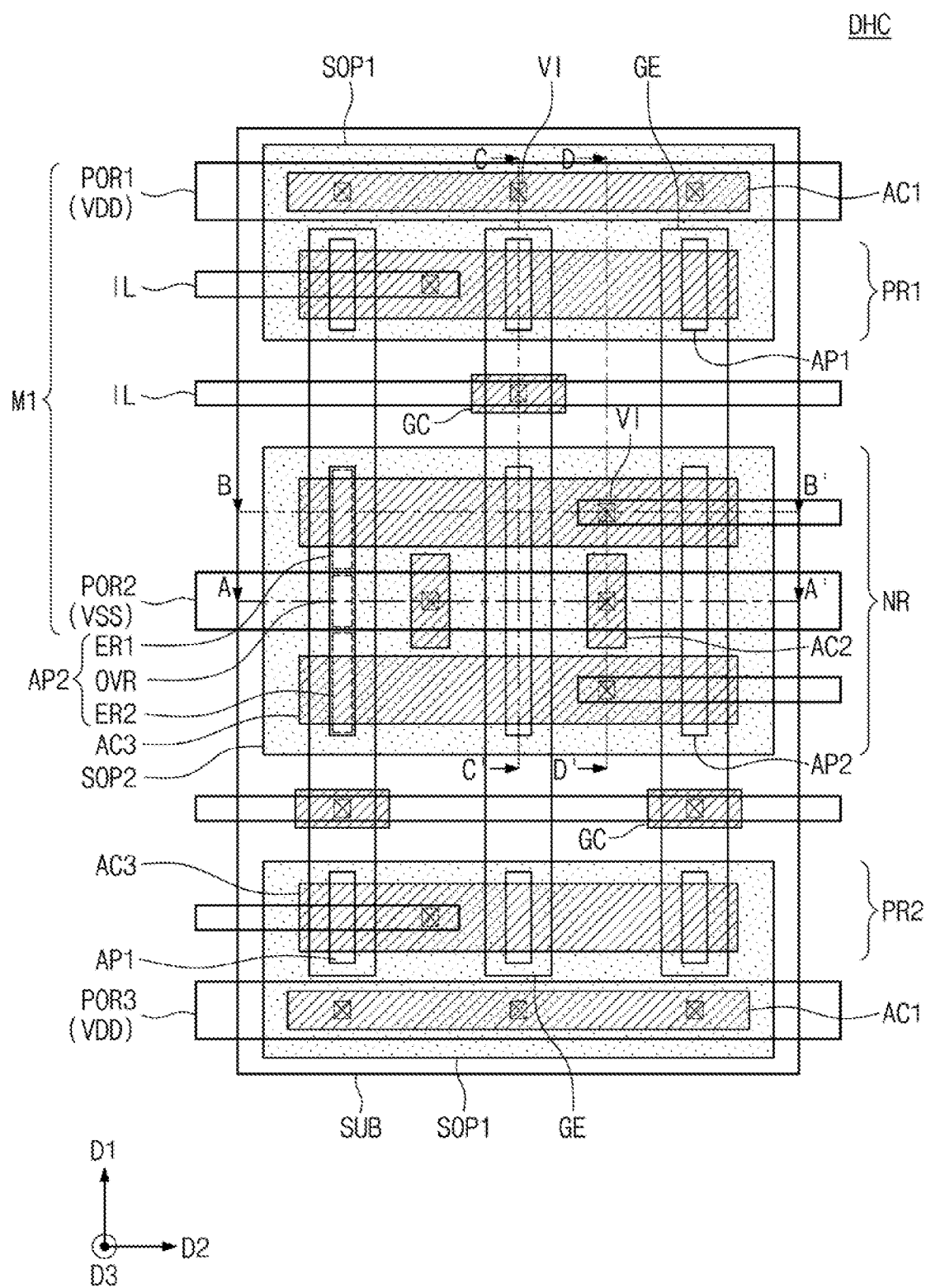
FIG. 4 illustrates a plan view showing a semiconductor device according to an example embodiment.

FIG. 4 illustrates a plan view showing a semiconductor device according to an example embodiment. FIGS. 5A, 5B, 5C, and 5D illustrate cross-sectional views respectively taken along lines A-A', B-B', C-C', and D-D' of FIG. 4.

A semiconductor device according to the present example embodiment is an illustrative example of the double height cell DHC discussed above with reference to FIG. 2.

Referring to FIGS. 4 and 5A to 5D, a double height cell DHC may be provided on a substrate SUB. The double height cell DHC according to an example embodiment may include vertical transistors that constitute a logic circuit. The substrate SUB may be a compound semiconductor substrate or a semiconductor substrate including silicon, germanium, or silicon-germanium.

The substrate SUB may include a first PMOSFET region PR1, an NMOSFET region NR, and a second PMOSFET region PR2. The NMOSFET region NR may be interposed between the first and second PMOSFET regions PR1 and PR2 in the first direction D1. The first and second PMOSFET regions PR1 and PR2 and the NMOSFET region NR may be defined by a second trench TR2 formed on an upper portion of the substrate SUB. The first and second PMOSFET regions PR1 and PR2 and the NMOSFET region NR may respectively extend in a second direction D2, which may be a second horizontal direction.

A first source pattern SOP1 may be provided on each of the first and second PMOSFET regions PR1 and PR2. When viewed in plan, a length in the first direction D1 of the first source pattern SOP1 may be greater than a width (e.g., W1 of FIG. 2) in the first direction D1 of each of the first and second PMOSFET regions PR1 and PR2. For example, the first source pattern SOP1 may cover the first PMOSFET region PR1 or the second PMOSFET region PR2. When viewed in plan, a second source pattern SOP2 may have the same size as that of the NMOSFET region NR. The second source pattern SOP2 and the NMOSFET region NR may overlap each other.

The first and second source patterns SOP1 and SOP2 may each be a portion of the substrate SUB. The first and second source patterns SOP1 and SOP2 may be formed by doping impurities into upper portions of the substrate SUB. The first source pattern SOP1 may be a p-type impurity area of the substrate SUB. The second source pattern SOP2 may be an n-type impurity area of the substrate SUB.

First active patterns AP1 may be provided on the first source pattern SOP1 of each of the first and second PMOSFET regions PR1 and PR2. Second active patterns AP2 may be provided on the second source pattern SOP2 of the NMOSFET region NR. The first active pattern AP1 may be a semiconductor pillar that projects in a vertical direction (e.g., a third direction D3) and is grown from the first source pattern SOP1 that serves as a seed. The second active pattern AP2 may be a semiconductor pillar that projects in the third direction D3 and grown from the second source pattern SOP2 that serves as a seed. The first and second active patterns AP1 and AP2 may include a semiconductor material the same as or different from that of the substrate SUB. For example, the first and second active patterns AP1 and AP2 may include silicon.

A first trench TR1 may be defined between adjacent first active patterns AP1 and between adjacent second active patterns AP2. The substrate SUB may include thereon a device isolation layer ST that fills the first and second trenches TR1 and TR2. The device isolation layer ST may include a silicon oxide layer.

When viewed in plan, each of the first and second active patterns AP1 and AP2 may have a bar shape that extends in the first direction D1. The first active patterns AP1 on the first and second PMOSFET regions PR1 and PR2 may be arranged in the second direction D2 at a first pitch. The second active patterns AP2 on the NMOSFET region NR may be arranged in the second direction D2 at a second pitch. The first pitch and the second pitch may be the same as each other.

The first active patterns AP1 may protrude from the first source pattern SOP1. The first active patterns AP1 may protrude vertically relative to the device isolation layer ST. Each of the first active patterns AP1 may include a first channel pattern CHP1 that extends in the third direction D3 from the first source pattern SOP1, and may also include a first drain pattern DOP1 on the first channel pattern CHP1. The first drain pattern DOP1 may be an epitaxial pattern that is selectively epitaxially grown from the first channel pattern CHP1. The first channel pattern CHP1 may include undoped silicon, and the first drain pattern DOP1 may include silicon doped with p-type impurities.

The second active patterns AP2 may protrude from the second source pattern SOP2. The second active patterns AP2 may protrude vertically in the third direction D3 relative to the device isolation layer ST. Each of the second active patterns AP2 may include a second channel pattern CHP2 that extends in the third direction D3 from the second source pattern SOP2, and may also include a second drain pattern DOP2 on the second channel pattern CHP2. The second drain pattern DOP2 may be an epitaxial pattern that is selectively epitaxially grown from the second channel pattern CHP2. The second channel pattern CHP2 may include undoped silicon, and the second drain pattern DOP2 may include silicon doped with n-type impurities.

Figure 5A:
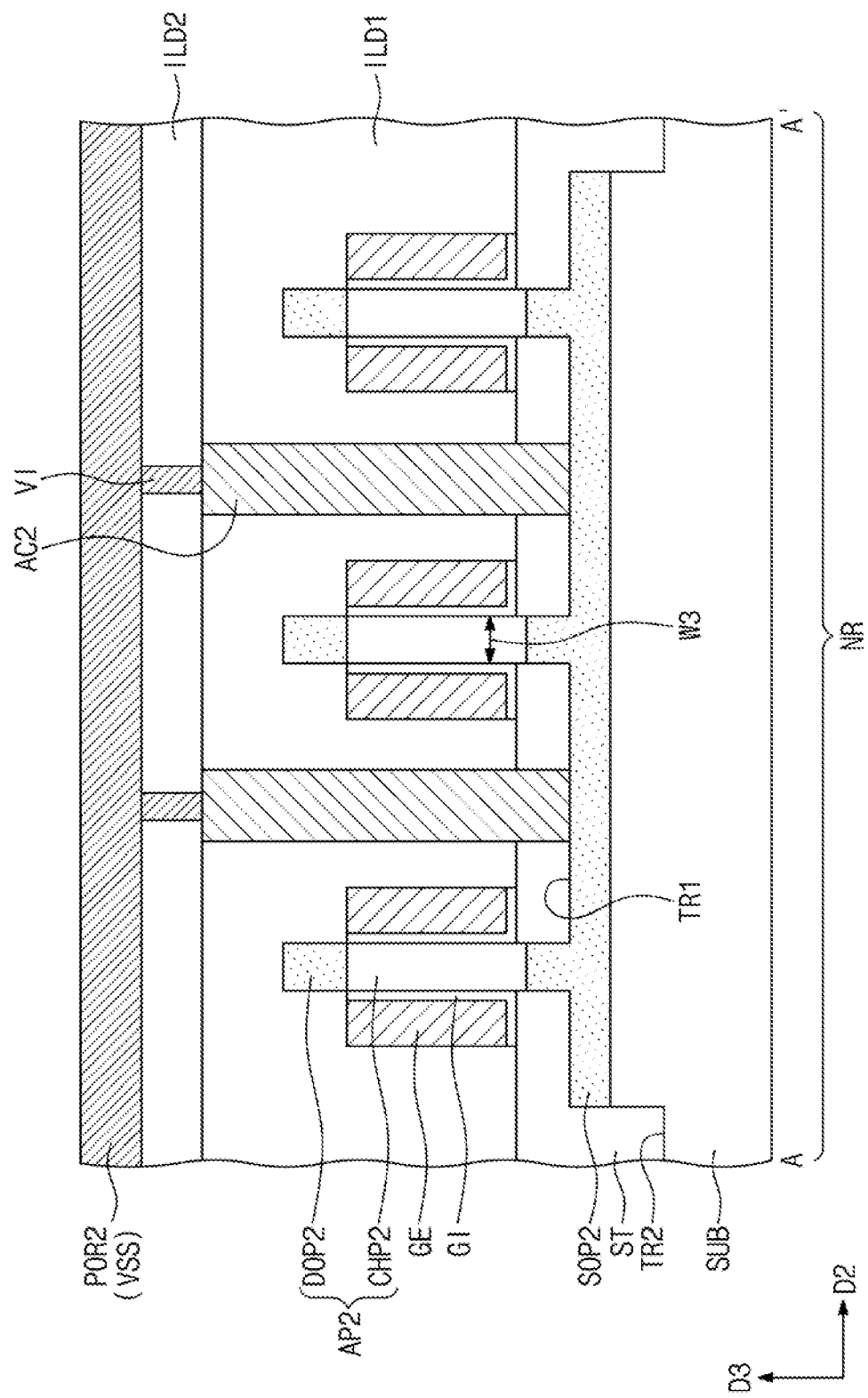
FIGS. 5A, 5B, 5C, and 5D illustrate cross-sectional views respectively taken along lines A-A', B-B', C-C', and D-D' of FIG. 4.
Figure 5B:
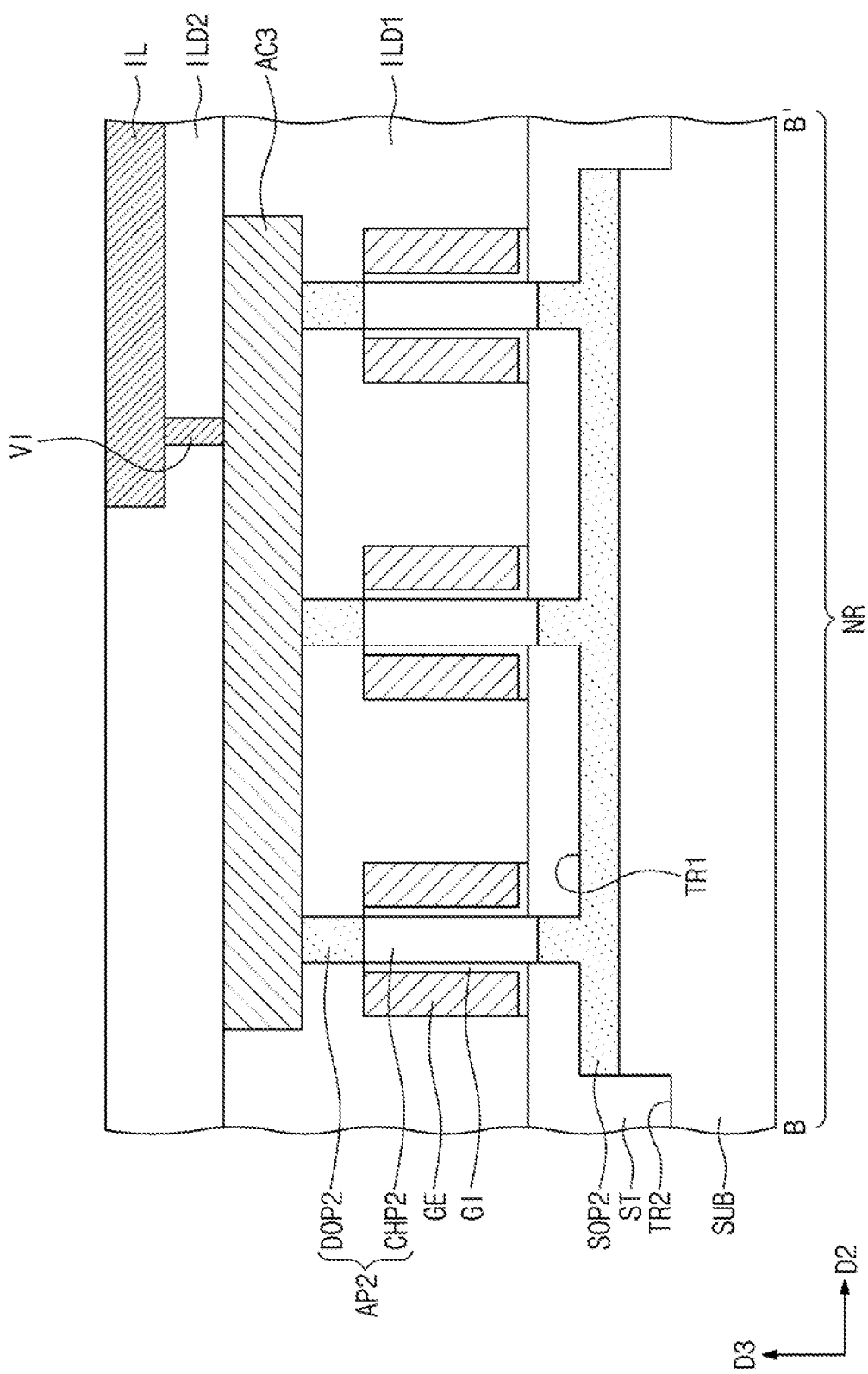

Each of the first and second active patterns AP1 and AP2 may have a third width W3 in the second direction D2, as shown in FIG. 5A. For example, the first and second active patterns AP1 and AP2 may have substantially the same width.

Figure 5C:
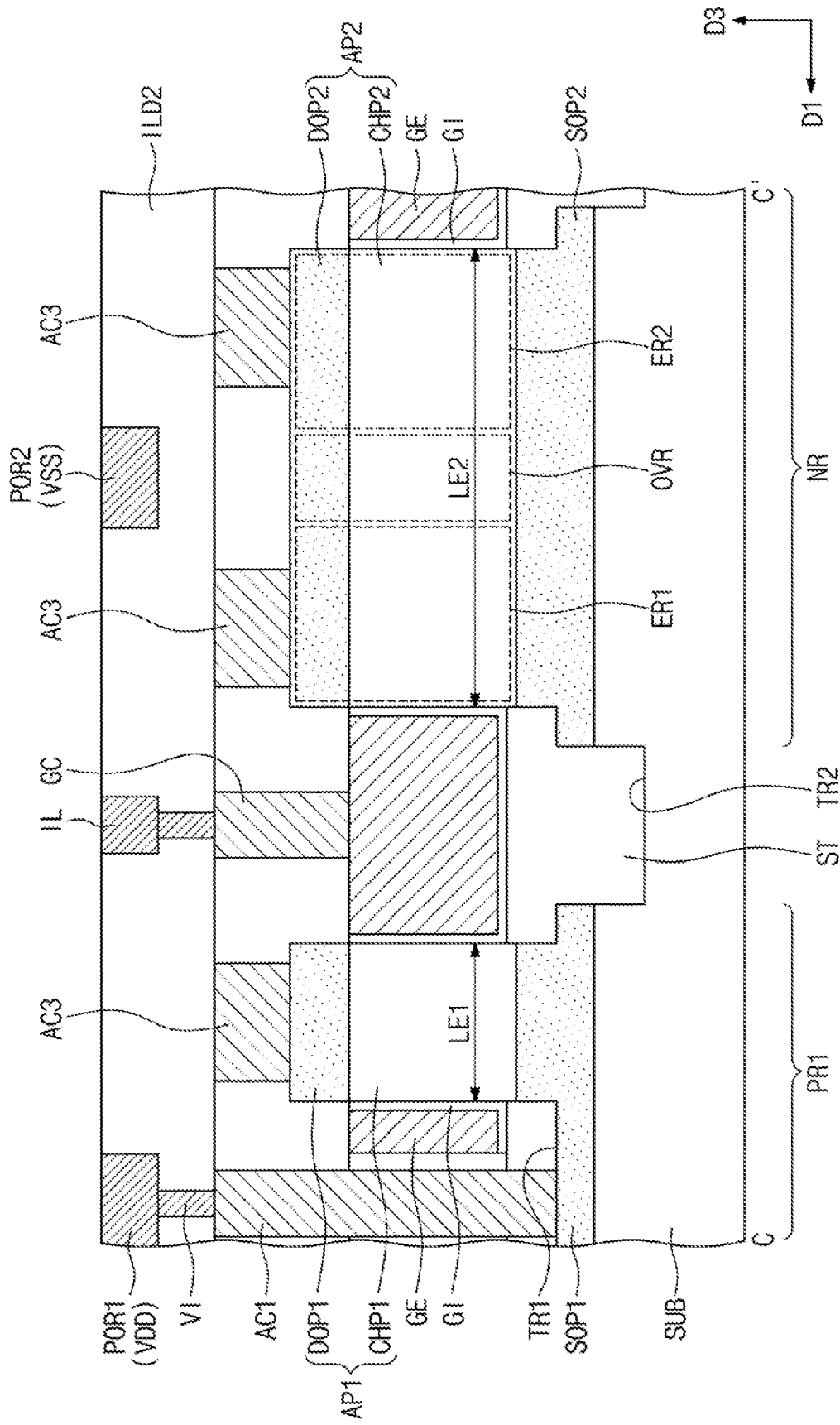
Figure 5D:
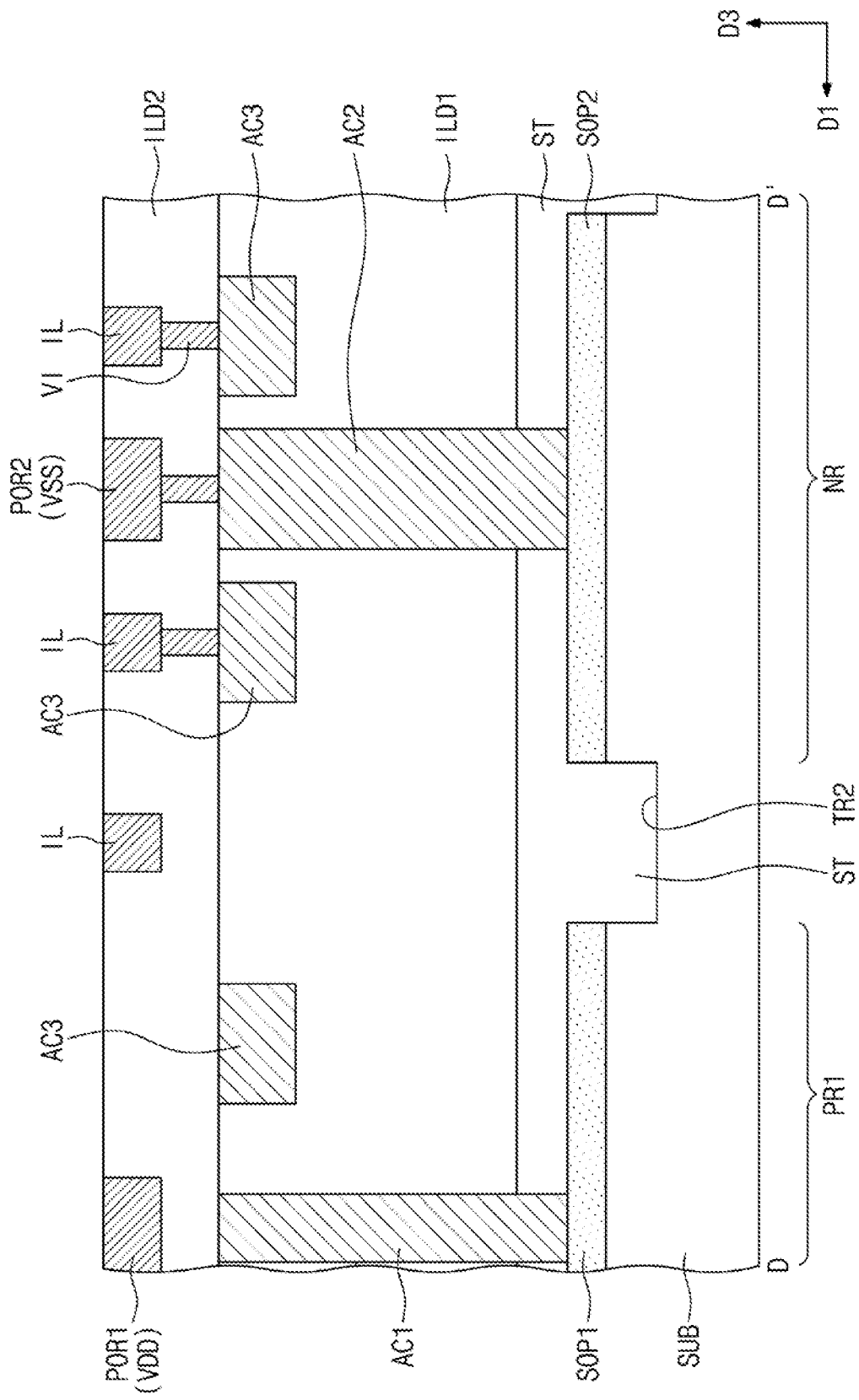

Referring to FIG. 5C, the first active pattern AP1 may have a first length LE1 in the first direction D1. The second active pattern AP2 may have a second length LE2 in the first direction D1. The second length LE2 may be two to five times the first length LE1. For example, the second length LE2 may be two to three times the first length LE1.

Referring to FIGS. 4 and 5C, the second active pattern AP2 may include an overlapping region OVR that vertically overlaps a second power rail POR2. The second active pattern AP2 may include a first extension region ER1 that extends in the first direction D1 from the overlapping region OVR, and may also include a second extension region ER2 that extends from the overlapping region OVR in a direction opposite to the first direction D1. When viewed in plan, the second power rail POR2 may run across the second active patterns AP2 that are arranged in the second direction D2.

Referring to, e.g., FIG. 4, the first active patterns AP1 on the first PMOSFET region PR1 may not vertically overlap a first power rail POR1. The first active patterns AP1 on the first PMOSFET region PR1 may be offset from the first power rail POR1. The first active patterns AP1 on the second PMOSFET region PR2 may not vertically overlap a third power rail POR3. The first active patterns AP1 on the second PMOSFET region PR2 may be offset from the third power rail POR3.

The device isolation layer ST may be provided thereon with a plurality of gate electrodes GE that extend parallel to each other in the first direction D1. The gate electrode GE may run across the first and second active patterns AP1 and AP2 that are arranged linearly in the first direction D1.

Each of the gate electrodes GE may have a bar or linear shape that extends in the first direction D1. At least one gate electrode GE may extend from the first PMOSFET region PR1 through the NMOSFET region NR to the second PMOSFET region PR2. The gate electrodes GE may not extend beyond a boundary of the double height cell DHC. For example, one end of the gate electrode GE may be adjacent to the first power rail POR1, and other end of the gate electrode GE may be adjacent to the third power rail POR3.

The gate electrode GE may surround the first and second active patterns AP1 and AP2 and the first and second channel patterns CHP1 and CHP2. The gate electrode GE may surround sidewalls of each of the first and second channel patterns CHP1 and CHP2. The gate electrode GE may include, for example, one or more of conductive metal nitride (e.g., titanium nitride or tantalum nitride) and metal (e.g., titanium, tantalum, tungsten, copper, or aluminum).

A gate dielectric pattern GI may be interposed between the gate electrode GE and each of the first and second channel patterns CHP1 and CHP2. The gate dielectric pattern GI may cover a bottom surface and inner walls of the gate electrode GE. The gate dielectric pattern GI may have an uppermost surface coplanar with a top surface of the gate electrode GE. The gate dielectric pattern GI may include one or more of a silicon oxide layer, a silicon oxynitride layer, and a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The first and second drain patterns DOP1 and DOP2 may vertically protrude above the gate electrode GE. The top surface of the gate electrode GE may be located at a level the same as or lower than that of a bottom surface of each of the first and second drain patterns DOP1 and DOP2. For example, each of the first and second active patterns AP1 and AP2 may have a structure that vertically extends from the substrate SUB and penetrates the gate electrode GE.

A semiconductor device according to the present embodiment may include vertical transistors in which carriers migrate in the third direction D3. For example, when the transistor is turned on due to voltage applied to the gate electrode GE, the carriers may migrate from the source pattern SOP1 or SOP2 through the channel pattern CHP1 or CHP2 to the drain pattern DOP1 or DOP2. The gate electrode GE according to the present embodiment may completely surround four sidewalls of the channel pattern CHP1 or CHP2. The vertical transistor according to the present embodiment may have a gate-all-around structure. Because the gate electrodes GE completely surround the channel patterns CHP1 and CHP2, the semiconductor device according to the present example embodiment may have excellent electrical characteristics.

A first interlayer dielectric layer ILD1 may be provided to cover the gate electrodes GE and the first and second active patterns AP1 and AP2. The first interlayer dielectric layer ILD1 may include, for example, a silicon oxide layer or a silicon oxynitride layer.

At least one first active contact AC1 may penetrate the first interlayer dielectric layer ILD1 and the device isolation layer ST and couple to the first source pattern SOP1. At least one second active contact AC2 may penetrate the first interlayer dielectric layer ILD1 and the device isolation layer ST and couple to the second source pattern SOP2. Third active contacts AC3 may penetrate the first interlayer dielectric layer ILD1 and couple to the first and second drain patterns DOP1 and DOP2. Gate contacts GC may penetrate the first interlayer dielectric layer ILD1 and couple to the gate electrodes GE.

The first power rail POR1 may have thereunder the first active contact AC1 coupled to the first source pattern SOP1 on the first PMOSFET region PR1. The first active contact AC1 may vertically overlap the first power rail POR1. The first active contact AC1 may have a bar shape that extends in the second direction D2.

The third power rail POR3 may have thereunder the first active contact AC1 coupled to the first source pattern SOP1 on the second PMOSFET region PR2. The first active contact AC1 may vertically overlap the third power rail POR3. The first active contact AC1 may have a bar shape that extends in the second direction D2.

Figure 6A:
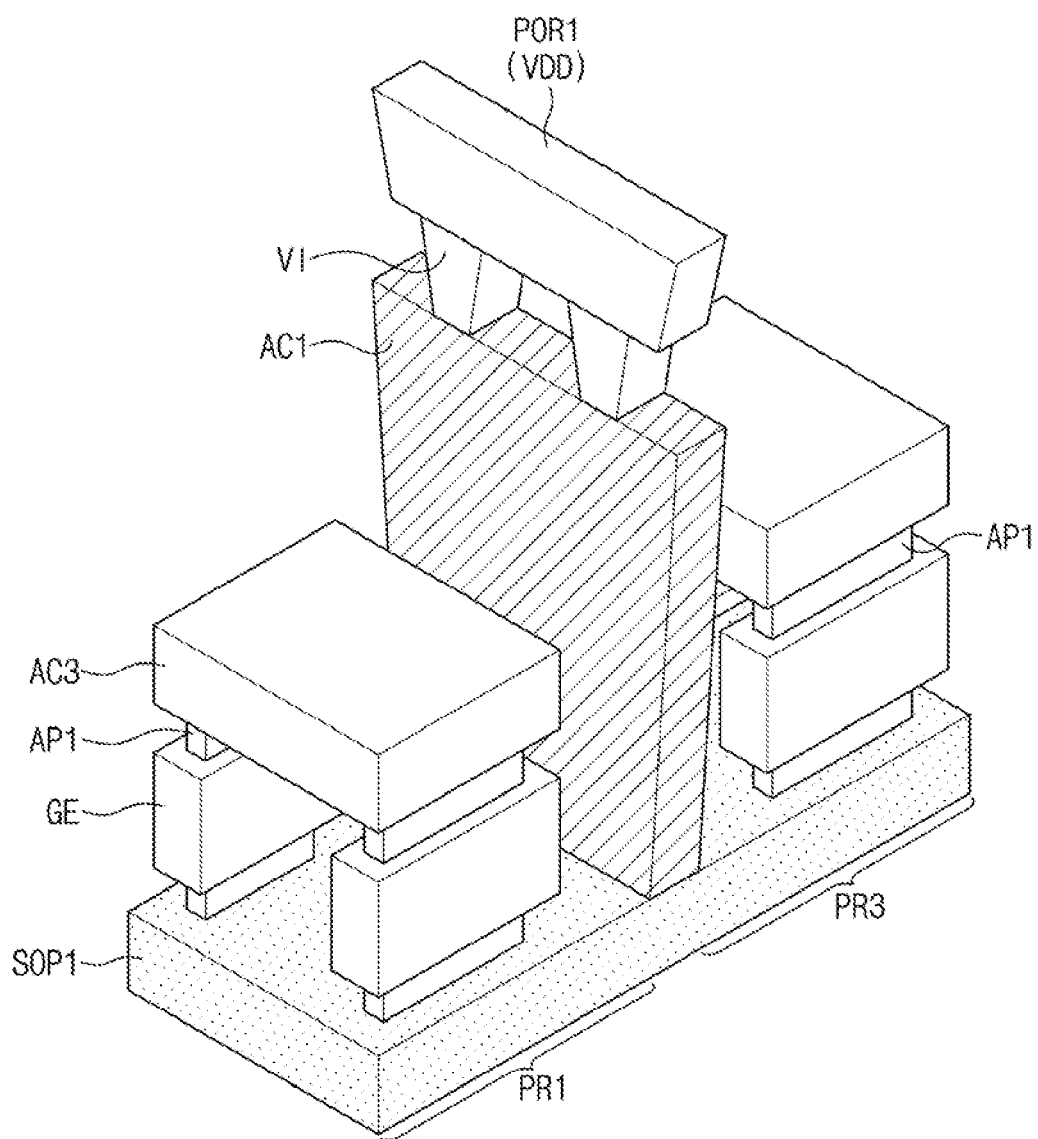
FIG. 6A illustrates a perspective view showing a vertical transistor on a first PMOSFET region and a third PMOSFET region that is adjacent in a first direction to the first PMOSFET region.

FIG. 6A illustrates a perspective view showing a vertical transistor on the first PMOSFET region PR1 and the third PMOSFET region PR3, the third PMOSFET region PR3 being adjacent in the first direction D1 to the first PMOSFET region PR1.

Referring to FIG. 6A, although not shown in FIG. 4, the third PMOSFET region PR3 may be provided to be adjacent in the first direction D1 to the first PMOSFET region PR1. The third PMOSFET region PR3 may be a PMOSFET region of another logic cell that is adjacent in the first direction D1 to the double height cell DHC of FIG. 4.

The first active contact AC1 may be between a pair of first active patterns AP1 that are adjacent to each other in the first direction D1. The first active contact AC1 may extend in the second direction D2 between the pair of first active patterns AP1. The first active contact AC1 may extend in the second direction D2 parallel to and below the first power rail POR1.

Referring back to FIG. 4, the second power rail POR2 may have thereunder the second active contact AC2 coupled to the second source pattern SOP2 on the NMOSFET region NR. The second active contact AC2 may vertically overlap the second power rail POR2. The second active contact AC2 may have a planar shape different from that of the first active contact AC1. The second active contact AC2 may have a bar shape that extends in the first direction D1.

Figure 6B:
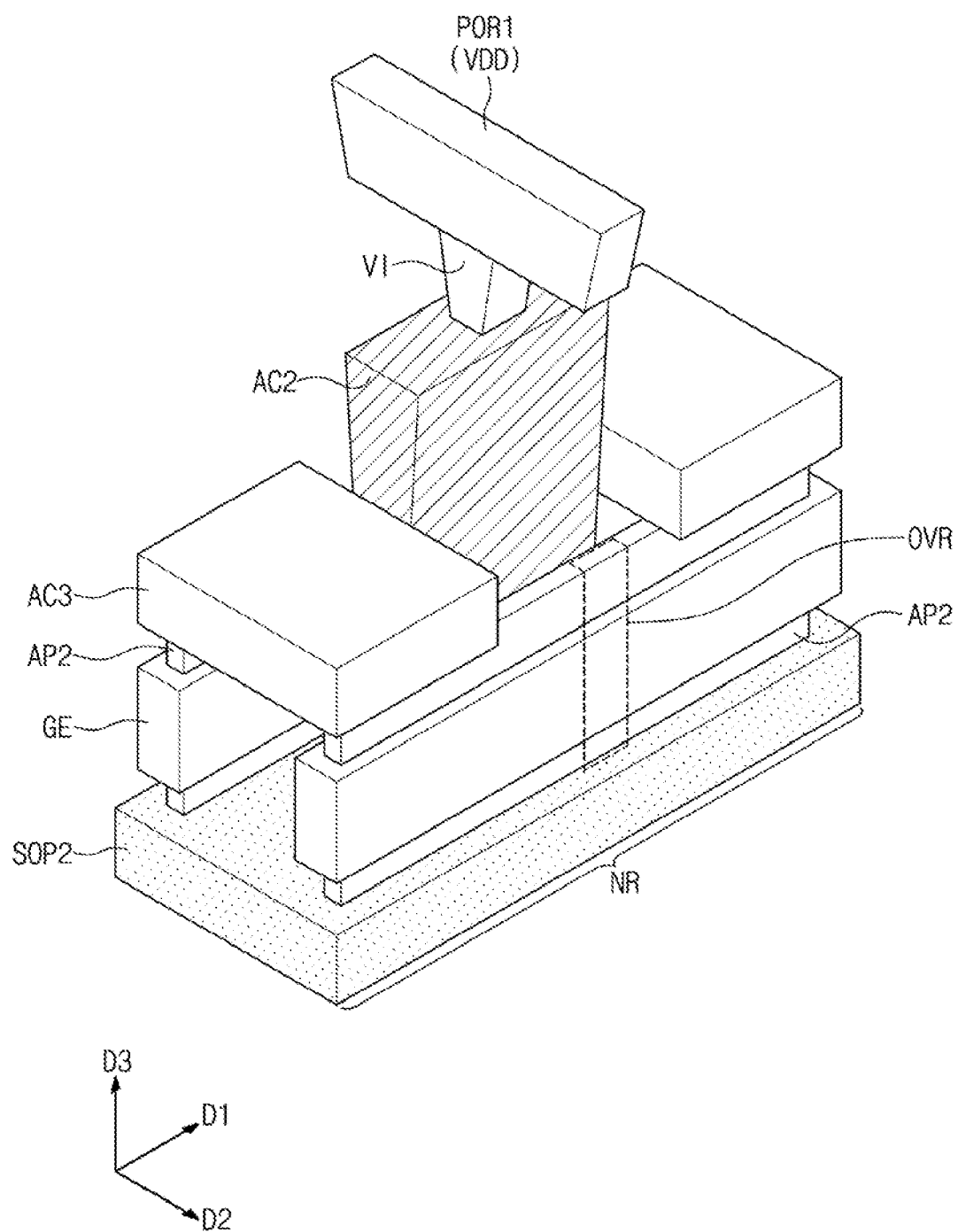
FIG. 6B illustrates a perspective view showing a vertical transistor on an NMOSFET region.

FIG. 6B illustrates a perspective view showing a vertical transistor on the NMOSFET region NR.

Referring to FIG. 6B, the second active contact AC2 may be between a pair of second active patterns AP2 that are adjacent to each other in the second direction D2. The second active contact AC2 may extend in the first direction D1 between the pair of second active patterns AP2. The second active contact AC2 may be coupled to a region of the second source pattern SOP2 between the pair of second active patterns AP2.

As shown in FIG. 6A, on the first source pattern SOP1, the first active pattern AP1 may be divided into two first active patterns AP1, which two first active patterns AP1 may be arranged in the first direction D1. Therefore, the first active contact AC1 may be disposed between the two first active patterns AP1.

In contrast, as shown in FIG. 6B, on the second source pattern SOP2, the second active pattern AP2 may not be divided, but instead may extend continuously in the first direction D1. Therefore, the second active contact AC2 may not have the same shape as that of the first active contact AC1. The second active contact AC2 may be disposed in a space between the second active patterns AP2 that are spaced apart from each other in the second direction D2.

Referring back to FIGS. 4 and 5A to 5D, the third active contact AC3 may have a bar shape that extends in the second direction D2. The third active contact AC3 may have a bottom surface in contact with top surfaces of the first and second drain patterns DOP1 and DOP2.

The third active contact AC3 may connect to each other the first drain patterns DOP1 that are arranged in the second direction D2. The third active contact AC3 may connect to each other the second drain patterns DOP2 that are arranged in the second direction D2.

The gate contact GC may be provided on the device isolation layer ST. The gate contact GC may have a bottom surface in contact with the top surface of the gate electrode GE. For example, the first to third active contacts AC1 to AC3 and the gate contacts GC may have their top surfaces coplanar with that of the first interlayer dielectric layer ILD1.

The first and second active contacts AC1 and AC2 may have their bottom surfaces at substantially the same level. The bottom surface of the gate contact GC may be higher than those of the first and second active contacts AC1 and AC2. The bottom surface of the third active contact AC3 may be higher than that of the gate contact GC.

The first to third active contacts AC1 to AC3 and the gate contacts GC may include one or more of conductive metal nitride (e.g., titanium nitride or tantalum nitride) and metal (e.g., titanium, tantalum, tungsten, copper, or aluminum).

A second interlayer dielectric layer ILD2 may be provided on the first interlayer dielectric layer ILD1. A first wiring layer M1 may be provided in the second interlayer dielectric layer ILD2. The first wiring layer M1 may include connection lines IL and the first, second, and third power rails POR1, POR2, and POR3. The conductive lines POR1, POR2, POR3, and IL of the first wiring layer M1 may have their linear shapes that extend parallel to each other in the second direction D2.

The first wiring layer M1 may have thereunder vias VI that electrically connect the first wiring layer M1 to its underlying first, second, and third active contacts AC1, AC2, and AC3 and the gate contacts GC. The first wiring layer M1 and the vias VI may include a metallic material, for example, cobalt, tungsten, or copper.

Each of the first and third power rails POR1 and POR3 may be electrically connected to its underlying first active contact AC1. The second power rail POR2 may be electrically connected to its underlying second active contacts AC2. The connection lines IL may have first connection lines that are electrically connected to corresponding third active contacts AC3. The connection lines IL may also have second connection lines that are electrically connected to corresponding gate contacts GC.

Although not shown, a plurality of wiring layers may further be provided on the first wiring layer M1. Logic cells of a semiconductor device may be connected to each other through the plurality of wiring layers.

FIGS. 7, 9, 11, 13, and 15 illustrate plan views of stages in a method of fabricating a semiconductor device according to an example embodiment. FIGS. 8A, 10A, 12A, 14A, 16A, and 18A illustrate cross-sectional views taken along line A-A' of FIGS. 7, 9, 11, 13, 15, and 17, respectively. FIGS. 8B, 10B, 12B, 14B, 16B, and 18B illustrate cross-sectional views taken along line B-B' of FIGS. 7, 9, 11, 13, 15, and 17, respectively.

Figure 7:
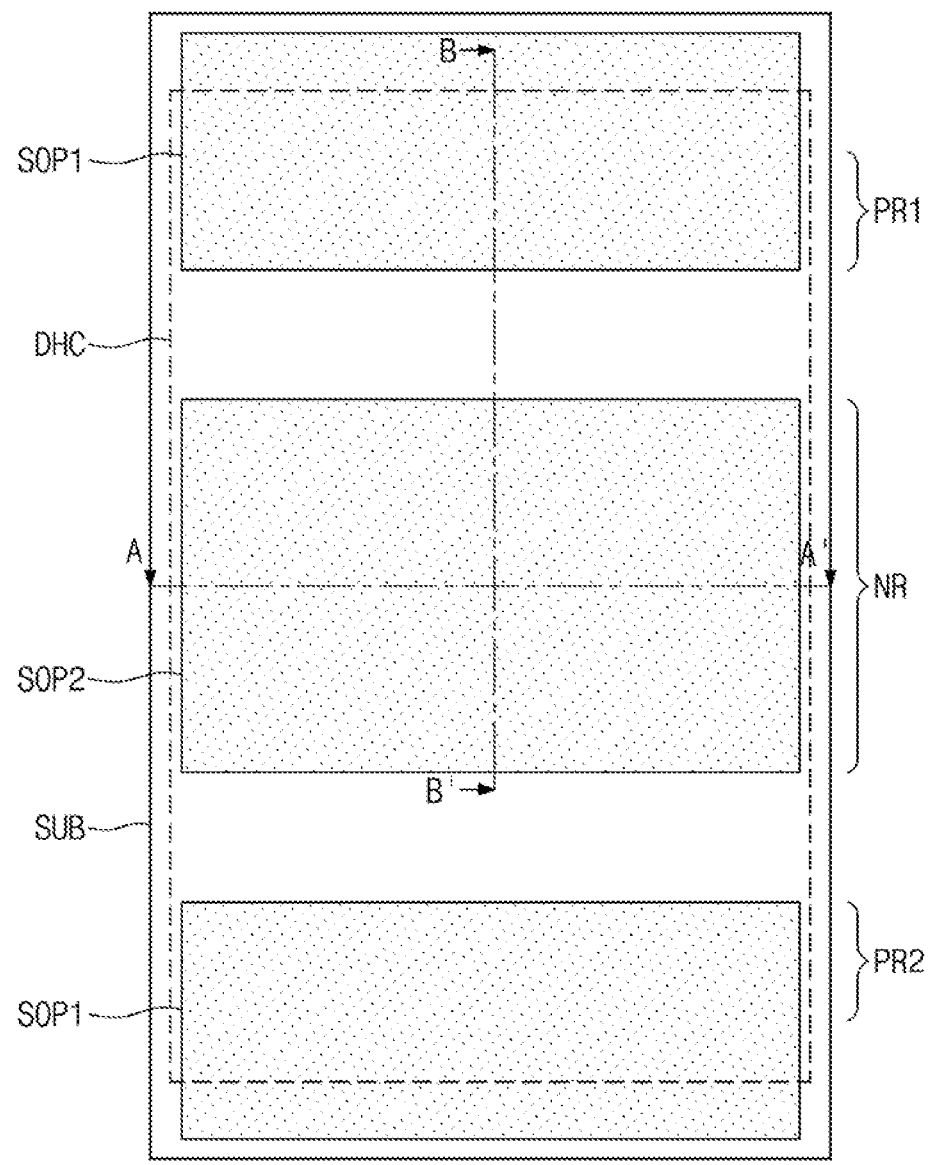
FIGS. 7, 9, 11, 13, 15, and 17 illustrate plan views of stages in a method of fabricating a semiconductor device according to an example embodiment.
Figure 7:
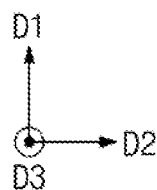
Figure 8B:
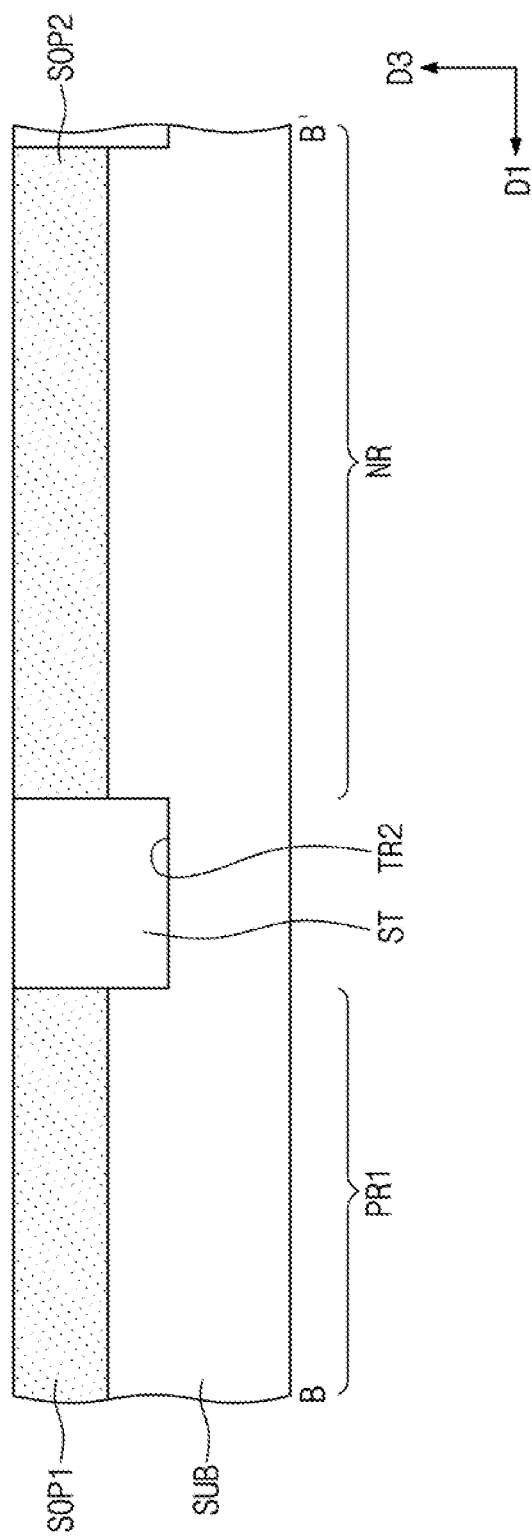
FIGS. 8B, 10B, 12B, 14B, 16B, and 18B illustrate cross-sectional views taken along line B-B' of FIGS. 7, 9, 11, 13, 15, and 17, respectively.

Referring to FIGS. 7, 8A, and 8B, a substrate SUB may be provided that has a region on which a double height cell DHC will be formed. The substrate SUB may include a first PMOSFET region PR1, an NMOSFET region NR, and a second PMOSFET region PR2.

The substrate SUB may be doped with impurities to form an impurity area on an upper portion of the substrate SUB. The impurity area of the first and second PMOSFET regions PR1 and PR2 may have a first conductivity type (e.g., p-type). The impurity area of the NMOSFET region NR may have a second conductivity type (e.g., n-type).

An upper portion of the substrate SUB may be patterned to form second trenches TR2 that define first and second source patterns SOP1 and SOP2. The first source patterns SOP1 may be formed on the first and second PMOSFET regions PR1 and PR2. The second source pattern SOP2 may be formed on the NMOSFET region NR.

A device isolation layer ST may be formed to fill the second trenches TR2. The formation of the device isolation layer ST may include forming on the substrate SUB a dielectric layer that fills the second trenches TR2, and then planarizing the dielectric layer until top surfaces of the first and second source patterns SOP1 and SOP2 are exposed. The device isolation layer ST may include, for example, a silicon oxide layer.

Figure 9:
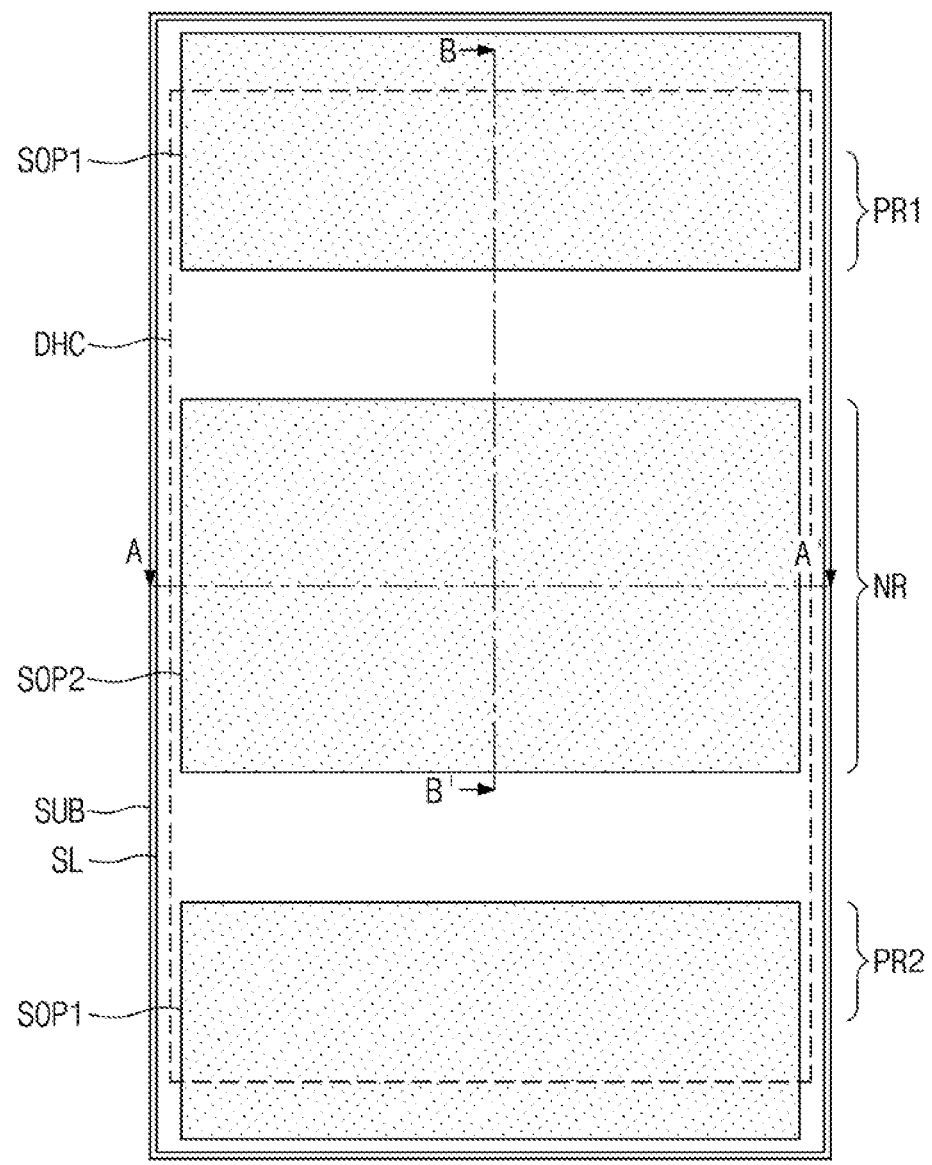
Figure 10B:
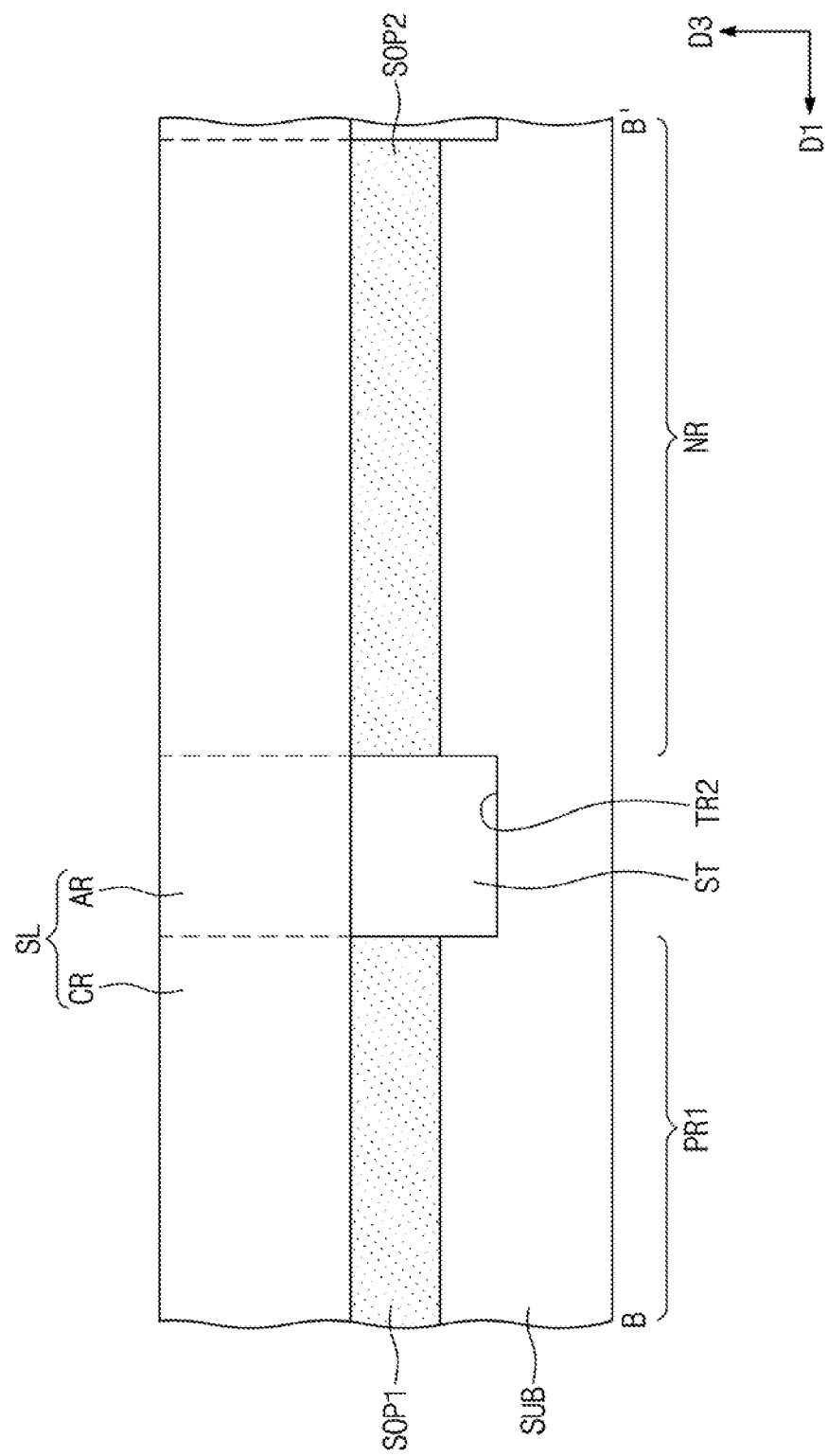

Referring to FIGS. 9, 10A, and 10B, an epitaxial growth process may be performed on an entire surface of the substrate SUB, thereby forming a semiconductor layer SL. The epitaxial growth process may be carried out by using a semiconductor element identical to or different from that of the substrate SUB. For example, silicon may be used to perform the epitaxial growth process, and thus the semiconductor layer SL may include a silicon layer.

The semiconductor layer SL may include crystalline regions CR on the first and second source patterns SOP1 and SOP2, and may also include an amorphous region AR on the device isolation layer ST. The crystalline regions CR of the semiconductor layer SL may grow from the first and second source patterns SOP1 and SOP2 that serve as seeds, and accordingly may have the same crystal structure as that of the first and second source patterns SOP1 and SOP2. The amorphous region AR of the semiconductor layer SL may grow from the device isolation layer ST that serves as a seed, and accordingly may be amorphous.

Figure 11:
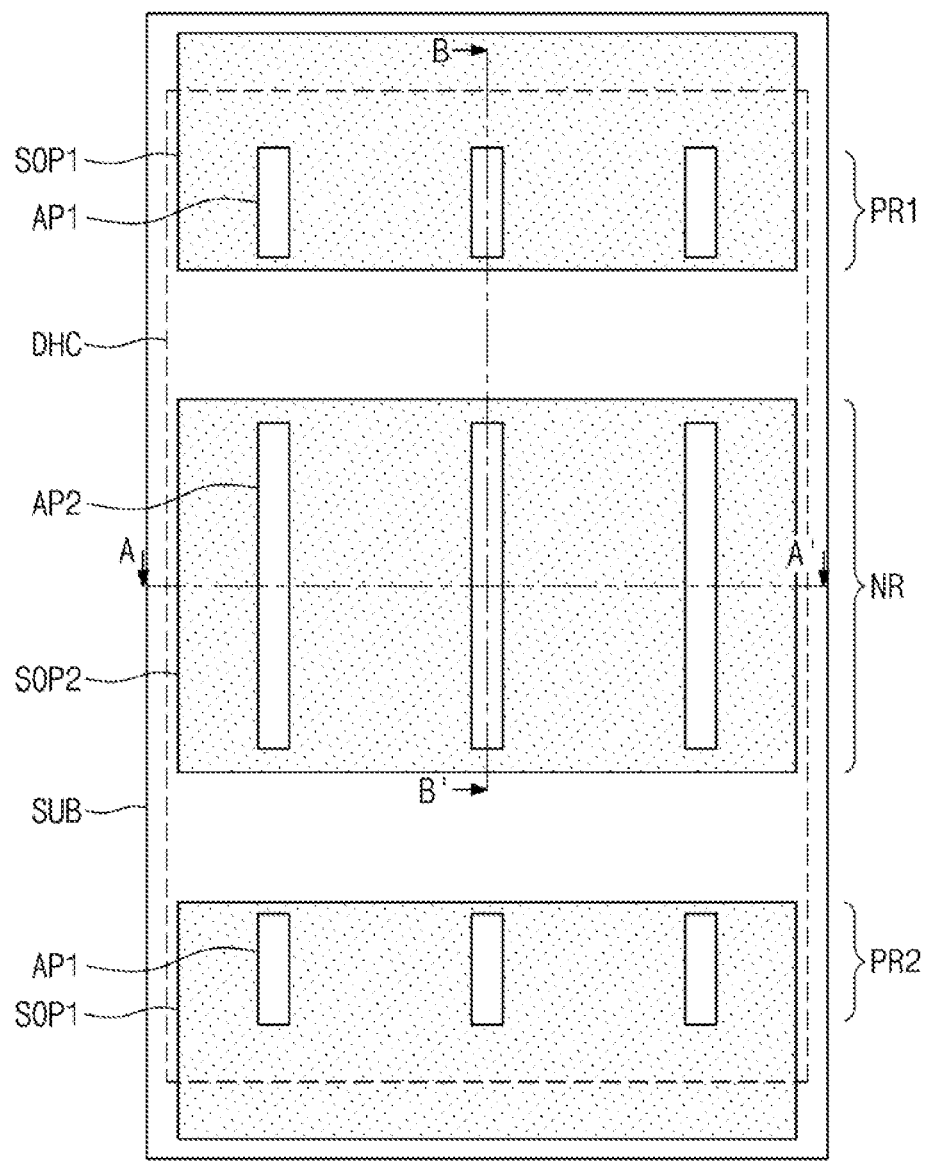
Figure 12A:
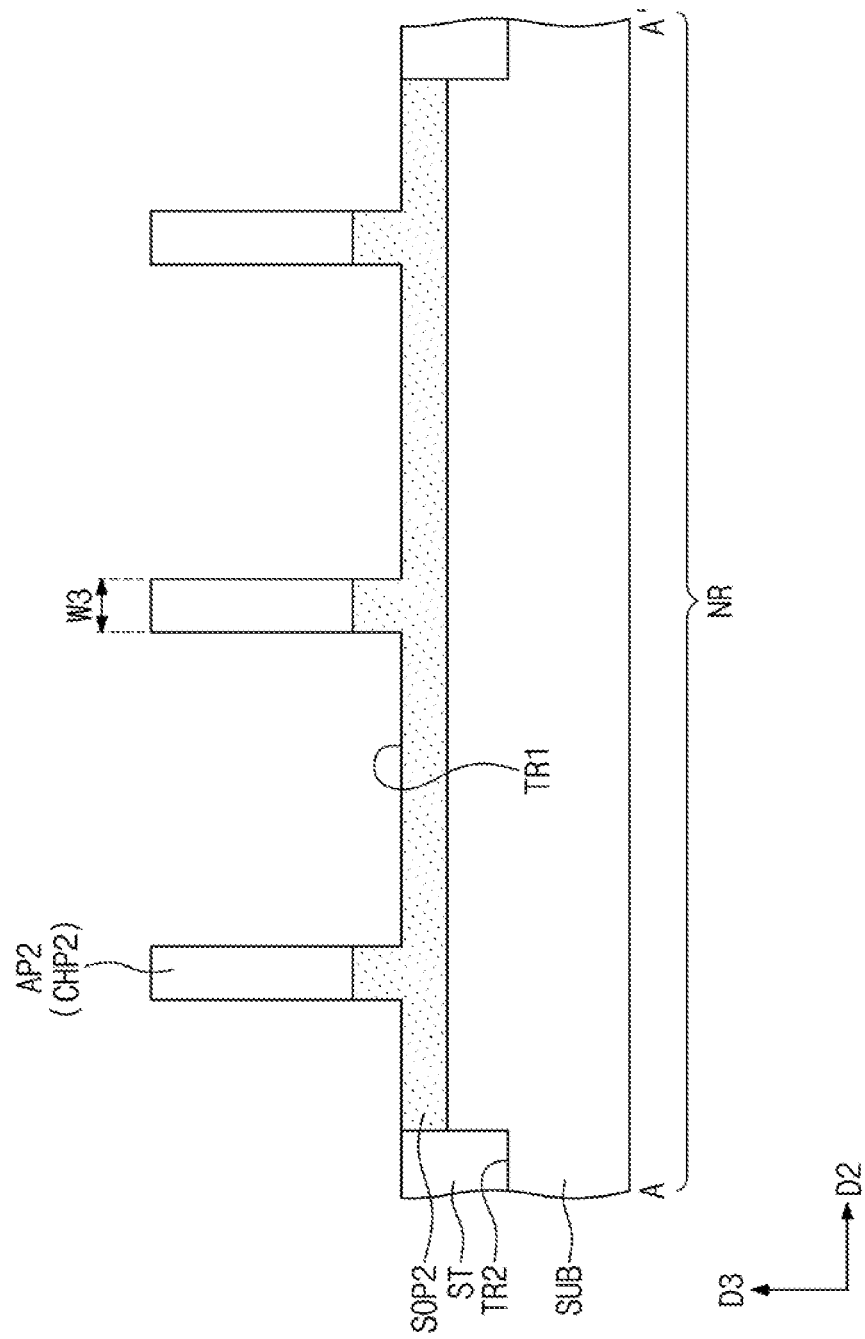
Figure 12B:
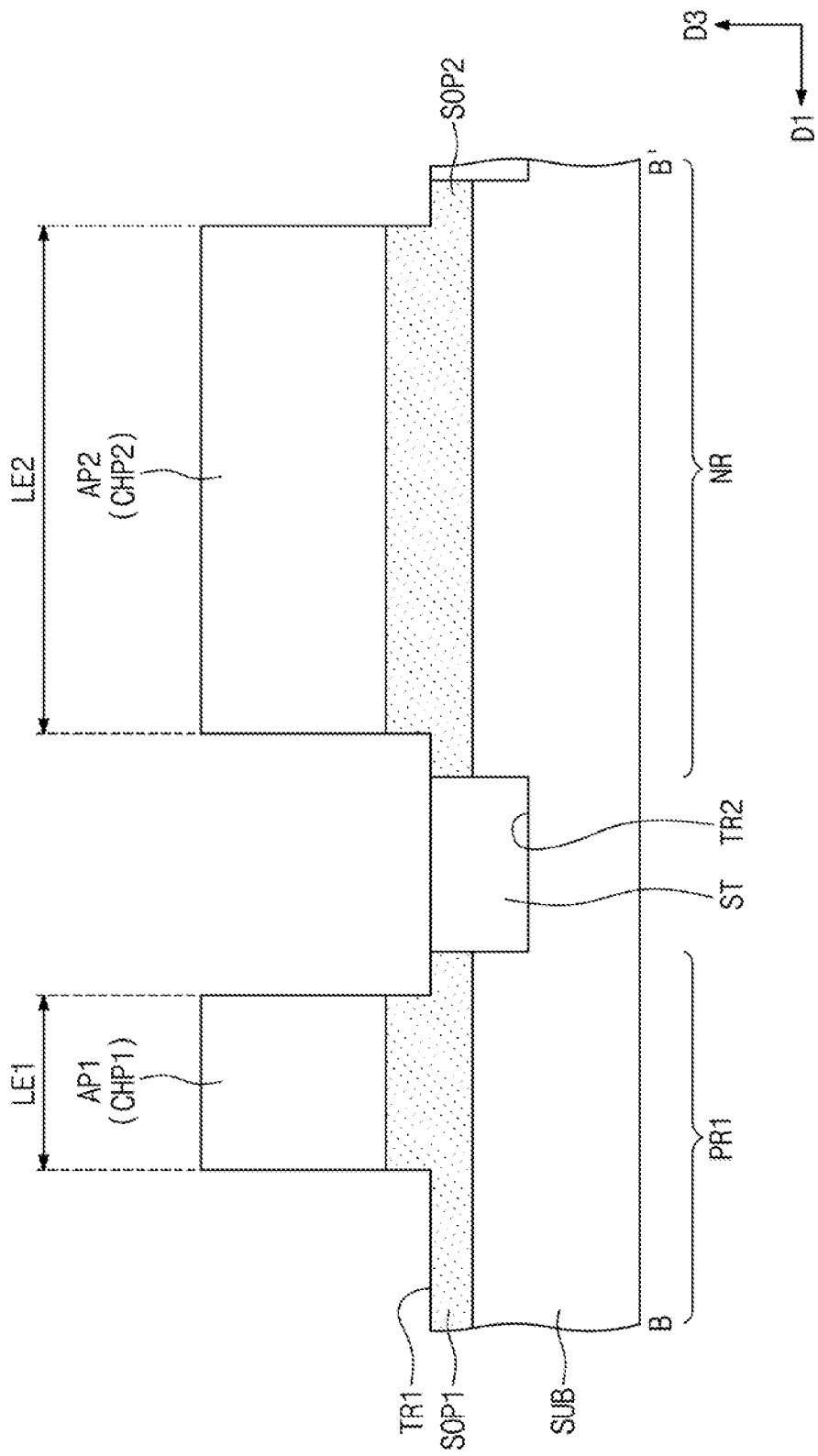

Referring to FIGS. 11, 12A, and 12B, the semiconductor layer SL may be patterned to form first and second active patterns AP1 and AP2. The first and second active patterns AP1 and AP2 may be formed on the first and second source patterns SOP1 and SOP2, respectively. For example, the formation of the first and second active patterns AP1 and AP2 may include forming a mask pattern on the semiconductor layer SL, and using the mask pattern as an etching mask to anisotropically etch the semiconductor layer SL.

While the semiconductor layer SL is etched, the first and second source patterns SOP1 and SOP2 may be partially etched to form first trenches TR1. The first trench TR1 may be formed between adjacent first active patterns AP1 or between adjacent second active patterns AP2.

Each of the first and second active patterns AP1 and AP2 may be formed to have a semiconductor columnar shape that vertically protrudes from a top surface of the substrate SUB. The first active pattern AP1 may include a first channel pattern CHP1 on the first source pattern SOP1. The second active pattern AP2 may include a second channel pattern CHP2 on the second source pattern SOP2. The first and second channel patterns CHP1 and CHP2 may include undoped crystalline silicon.

Each of the first and second active patterns AP1 and AP2 may be formed to have a third width W3 in a second direction D2. The first and second active patterns AP1 and AP2 may have substantially the same width. The first active pattern AP1 may be formed to have a first length LE1 in a first direction D1. The second active pattern AP2 may be formed to have a second length LE2 in the first direction D1. The second length LE2 may be two to five times the first length LE1. For example, the second length LE2 may be two to three times the first length LE1.

On the first source pattern SOP1, the first active patterns AP1 may be arranged in the second direction D2 at a first pitch. On the second source pattern SOP2, the second active patterns AP2 may be arranged in the second direction D2 at a second pitch. The first pitch and the second pitch may be the same as each other.

Figure 13:
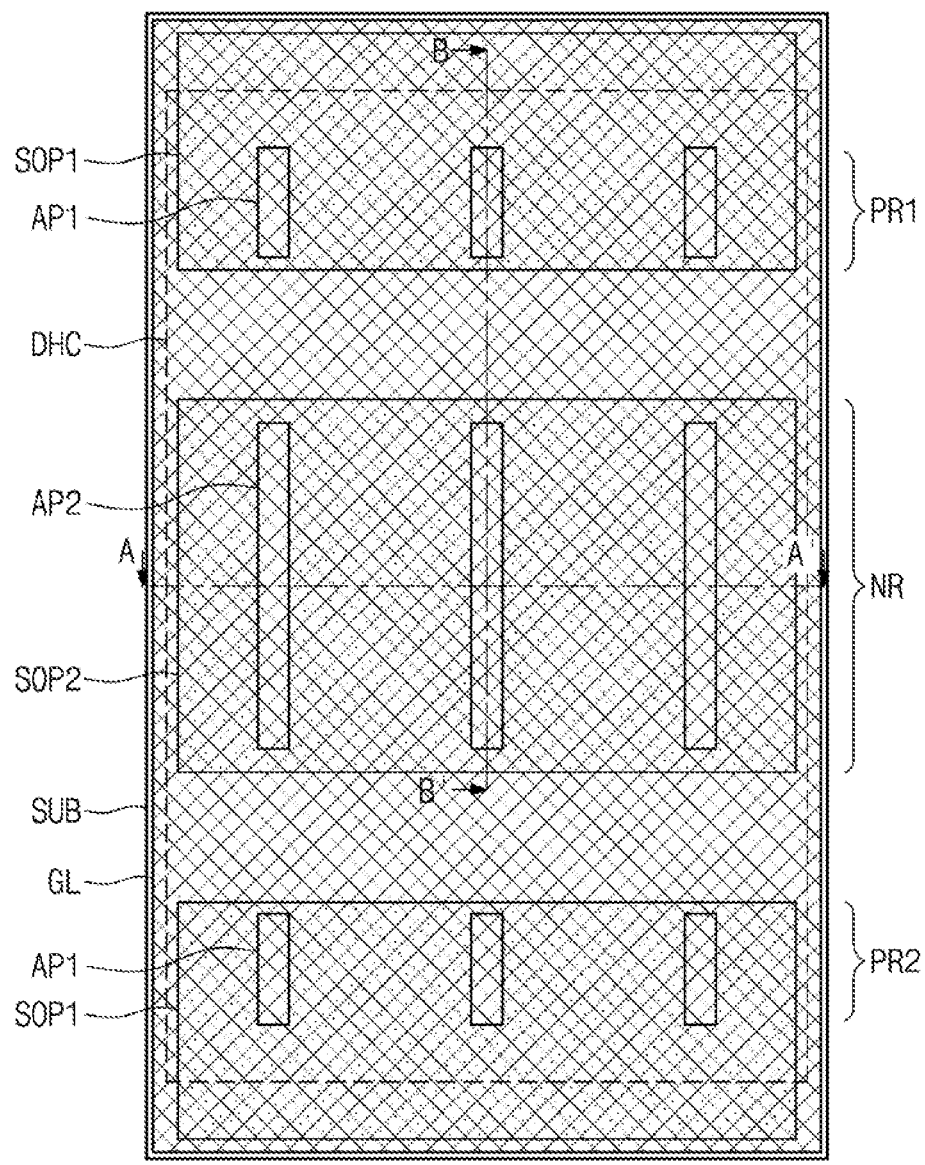
Figure 14A:
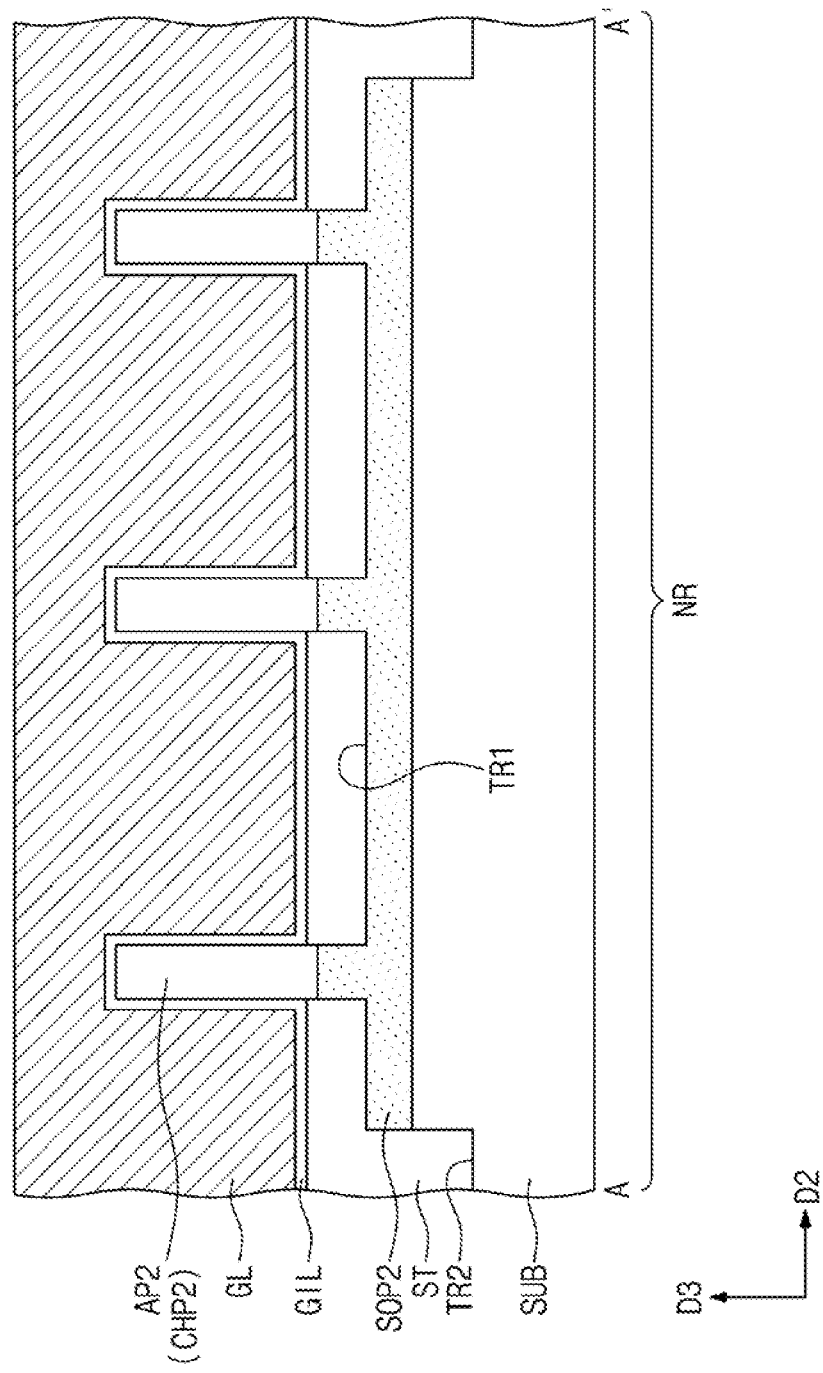
Figure 14B:
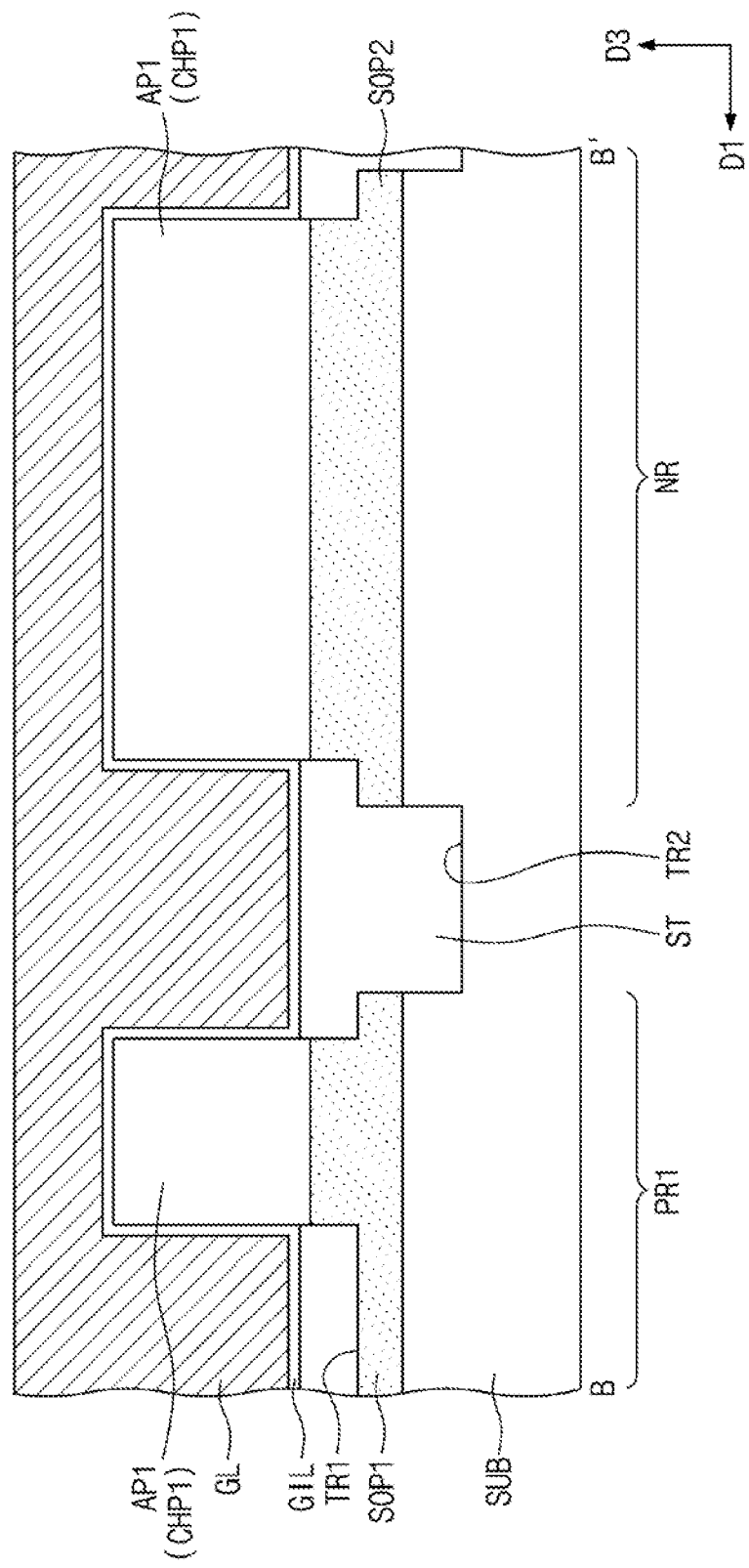

Referring to FIGS. 13, 14A, and 14B, a dielectric layer may be additionally deposited on the device isolation layer ST. As such, the device isolation layer ST may become thicker. The device isolation layer ST may have a top surface higher than those of the first and second source patterns SOP1 and SOP2. The first and second channel patterns CHP1 and CHP2 may be exposed on the device isolation layer ST.

A gate dielectric layer GIL and a gate electrode layer GL may be sequentially formed on the entire surface of the substrate SUB. The gate dielectric layer GIL may conformally cover the exposed first and second channel patterns CHP1 and CHP2. The gate electrode layer GL may fill spaces between the first and second channel patterns CHP1 and CHP2. The gate electrode layer GL may be formed to have a top surface higher than those of the first and second channel patterns CHP1 and CHP2.

The gate dielectric layer GIL may be formed by using, for example, atomic layer deposition (ALD) or chemical vapor deposition (CVD). The gate dielectric layer GIL may include a silicon oxide layer, a silicon oxynitride layer, or a high-k dielectric material. The gate electrode layer GL may include one or more of a conductive metal nitride material and a metallic material.

Figure 15:
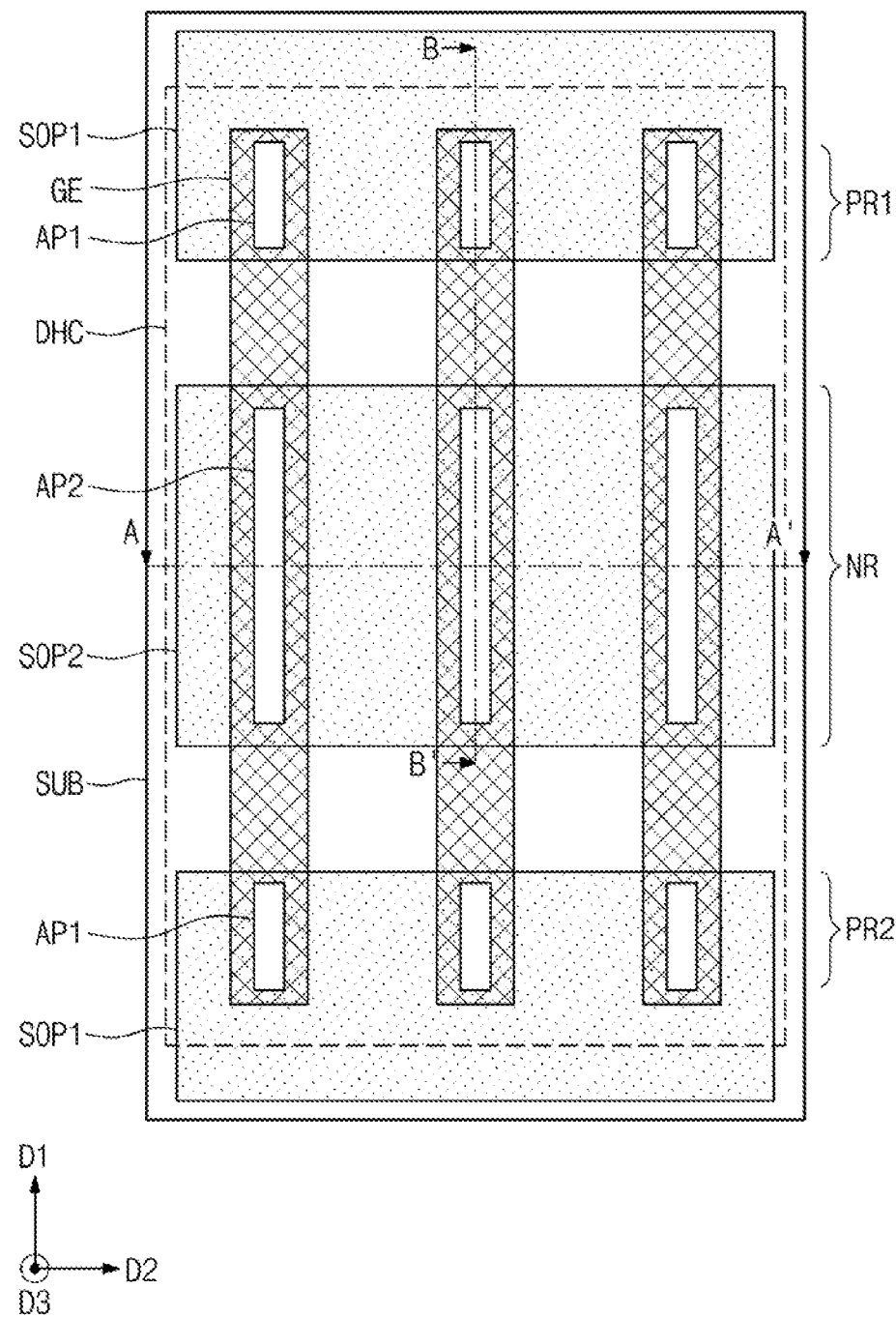
Figure 16A:
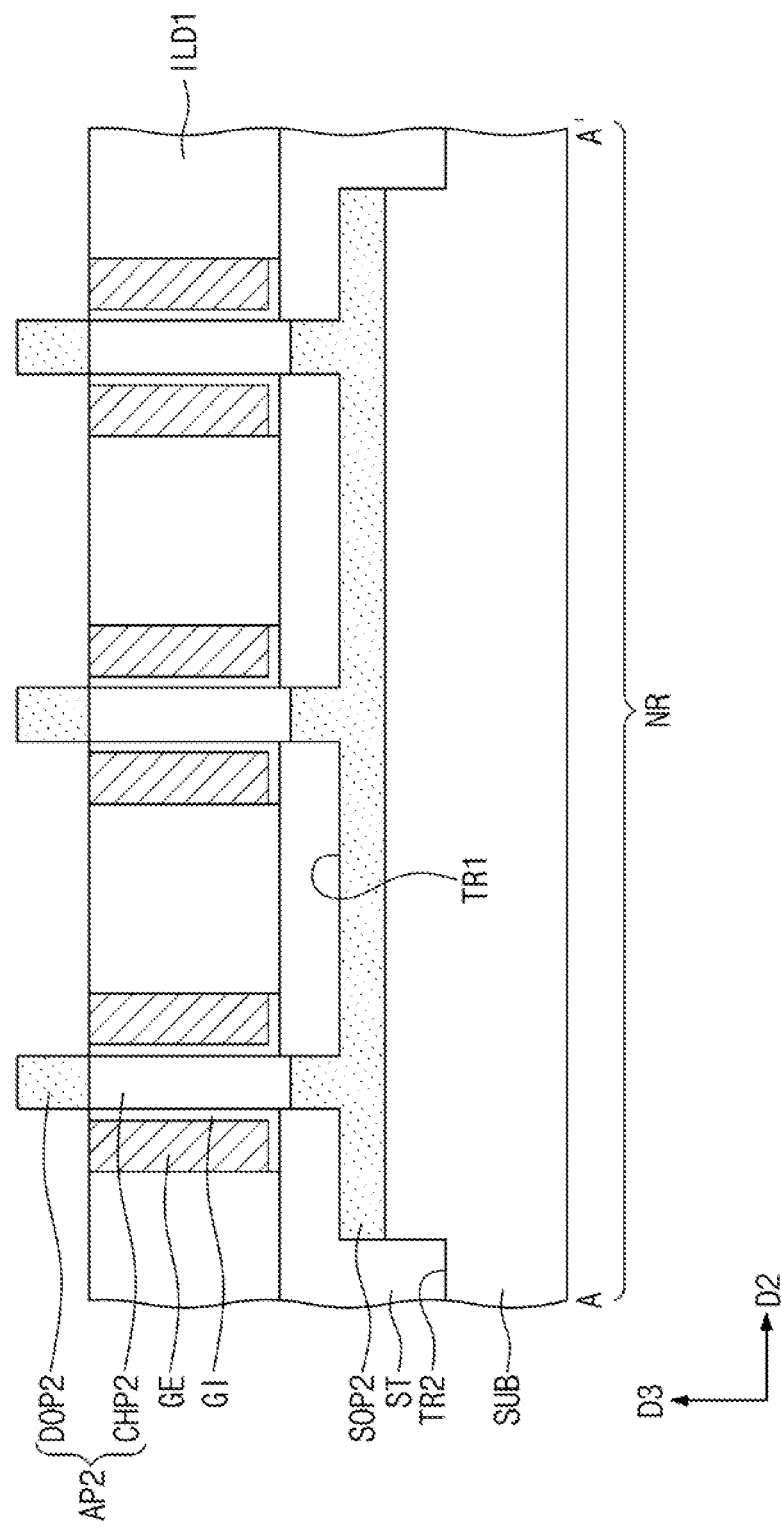
Figure 16B:
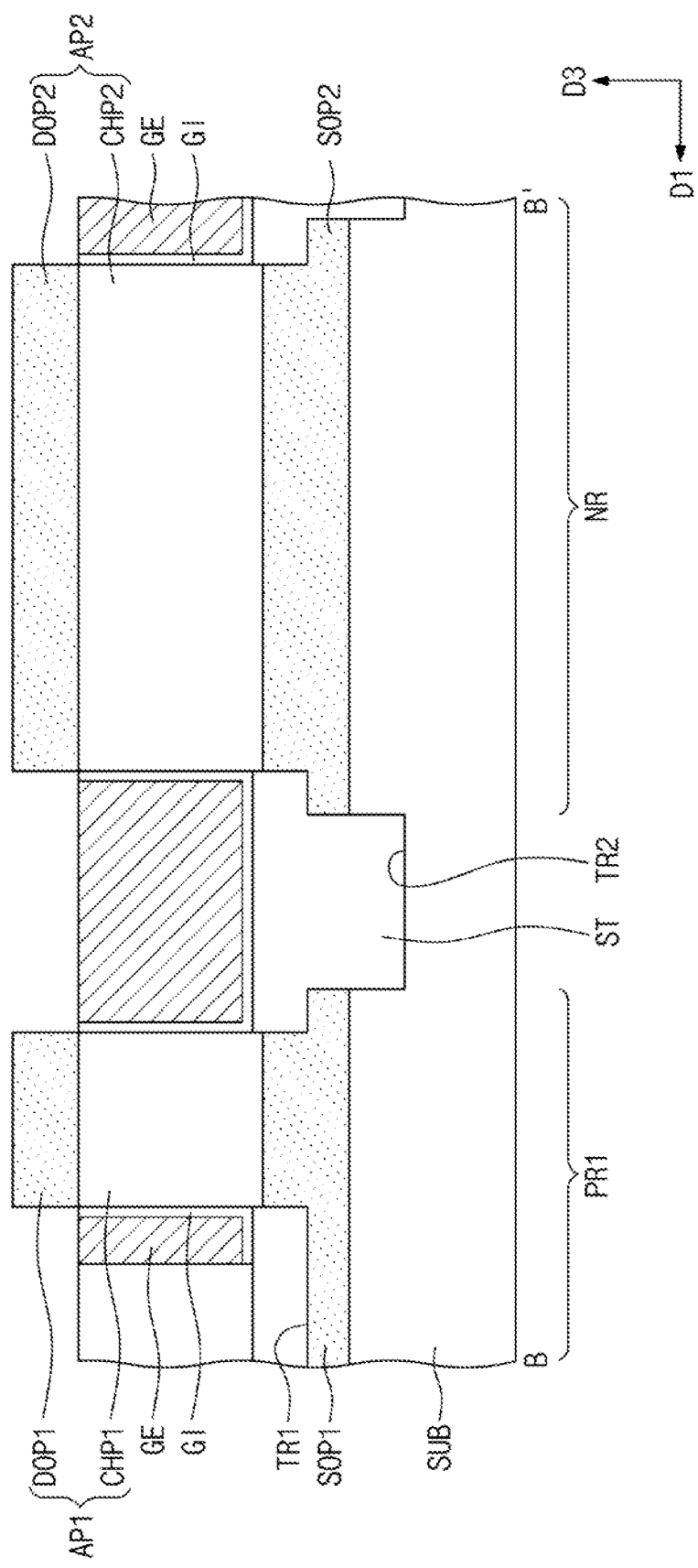

Referring to FIGS. 15, 16A, and 16B, the gate electrode layer GL may be patterned to form gate electrodes GE. The gate electrodes GE may be formed to extend parallel to each other in the first direction D1. For example, the gate electrode GE may extend in the first direction D1, while surrounding the first and second active patterns AP1 and AP2 that are aligned with each other in the first direction D1.

A first interlayer dielectric layer ILD1 may be formed on the gate electrodes GE. The first interlayer dielectric layer ILD1 may fill a space between the gate electrodes GE. The first interlayer dielectric layer ILD1 may include, for example, a silicon oxide layer or a silicon oxynitride layer.

A planarization process may be performed until the top surfaces of the first and second channel patterns CHP1 and CHP2 are exposed. Therefore, the gate electrodes GE and the first interlayer dielectric layer ILD1 may have their top surfaces coplanar with those of the first and second channel patterns CHP1 and CHP2.

A selective epitaxial growth process may be performed on the exposed top surfaces of the first and second channel patterns CHP1 and CHP2, and as a result, first and second drain patterns DOP1 and DOP2 may be formed respectively on the first and second channel patterns CHP1 and CHP2. The first and second drain patterns DOP1 and DOP2 may vertically protrude relative to the top surfaces of the gate electrodes GE. The first channel pattern CHP1 and the first drain pattern DOP1 may constitute a first active pattern AP1. The second channel pattern CHP2 and the second drain pattern DOP2 may constitute a second active pattern AP2.

Because the first and second drain patterns DOP1 and DOP2 are grown from the first and second channel patterns CHP1 and CHP2 that serve as seeds, the first and second drain patterns DOP1 and DOP2 may have the same crystal structure as that of the first and second channel patterns CHP1 and CHP2. The first and second drain patterns DOP1 and DOP2 may include silicon, germanium, or silicon-germanium. The first drain pattern DOP1 may be doped to have a first conductivity type, and the second drain pattern DOP2 may be doped to have a second conductivity type.

Figure 17:
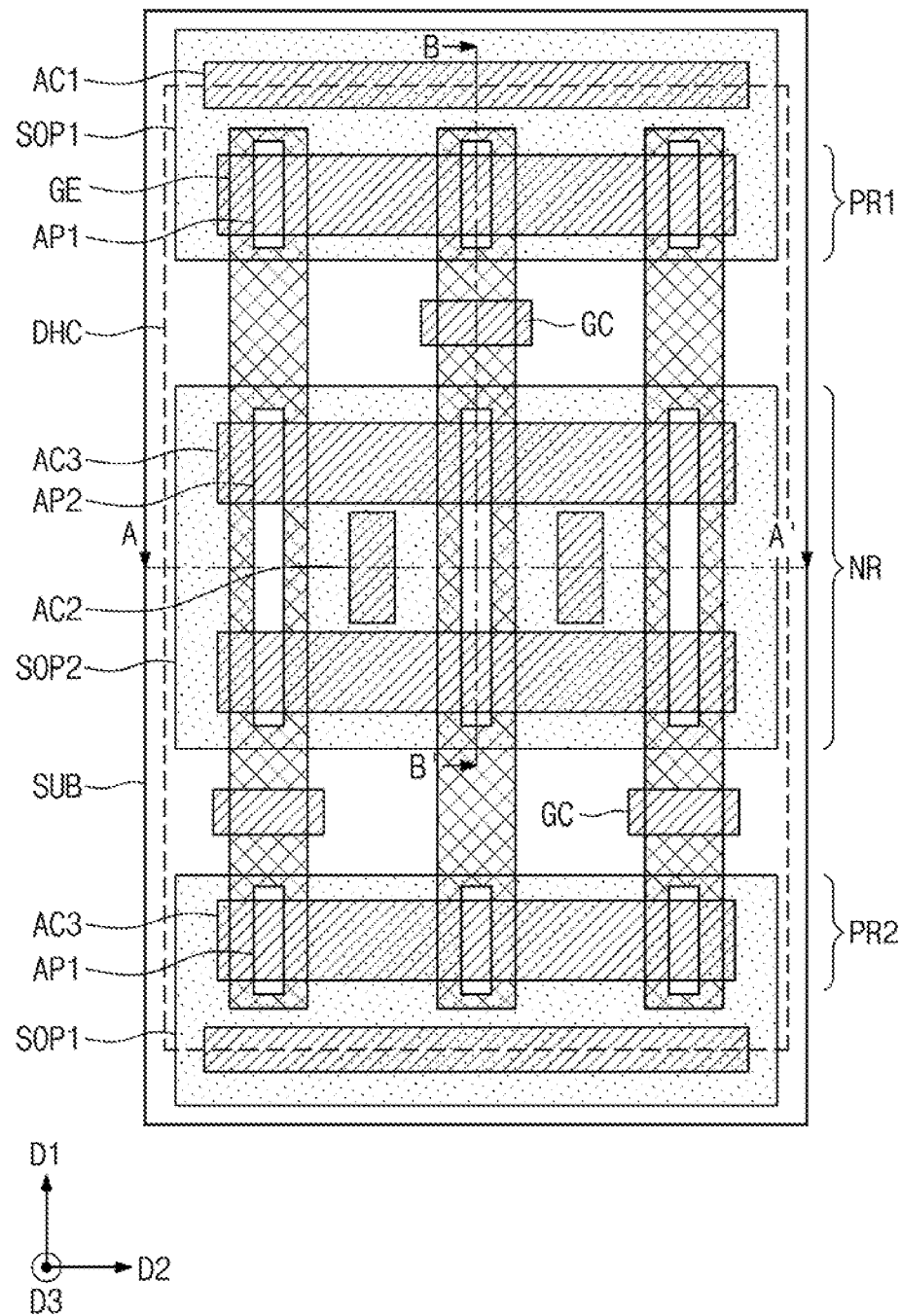
Figure 18A:
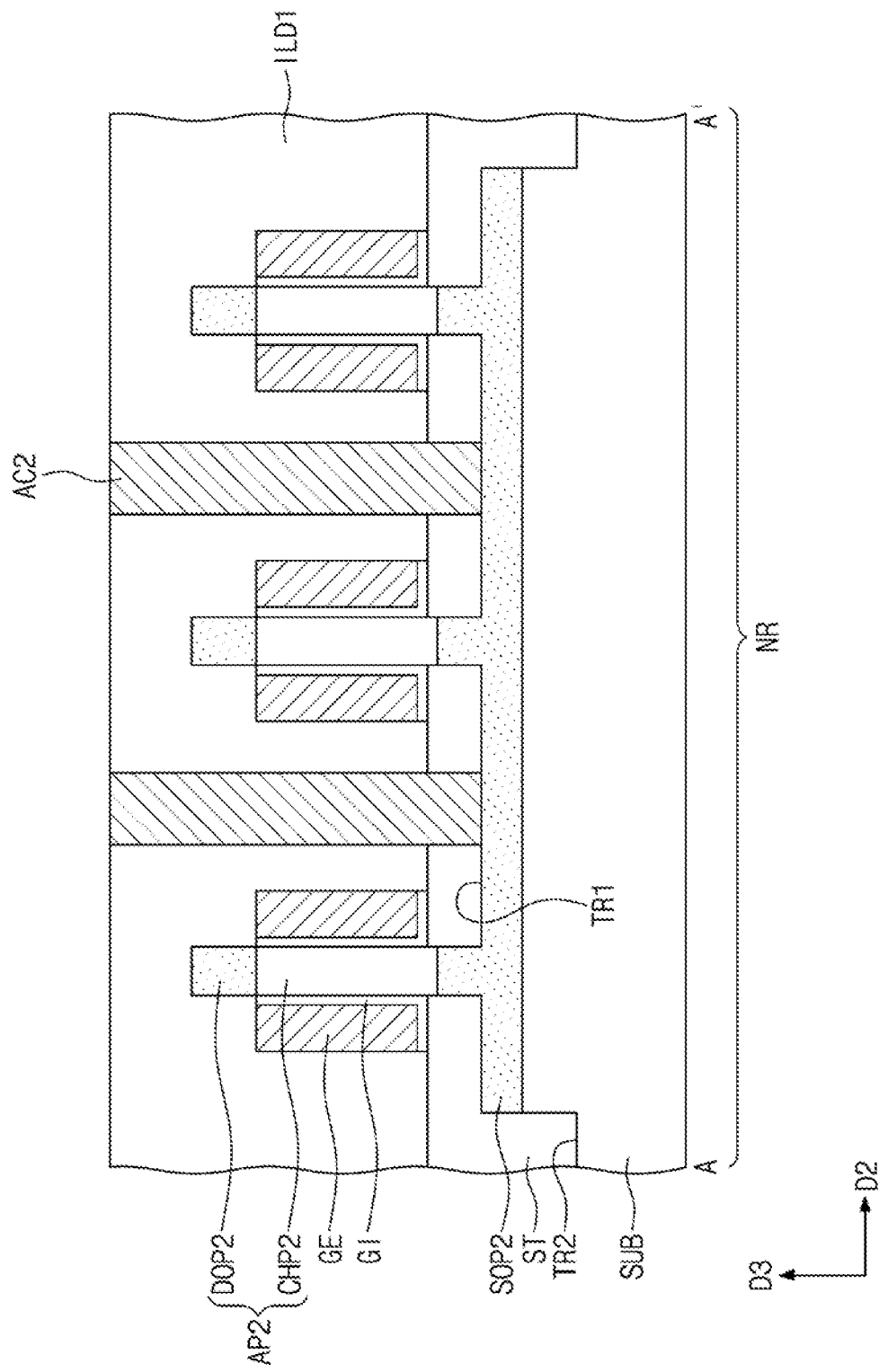
Figure 18B:
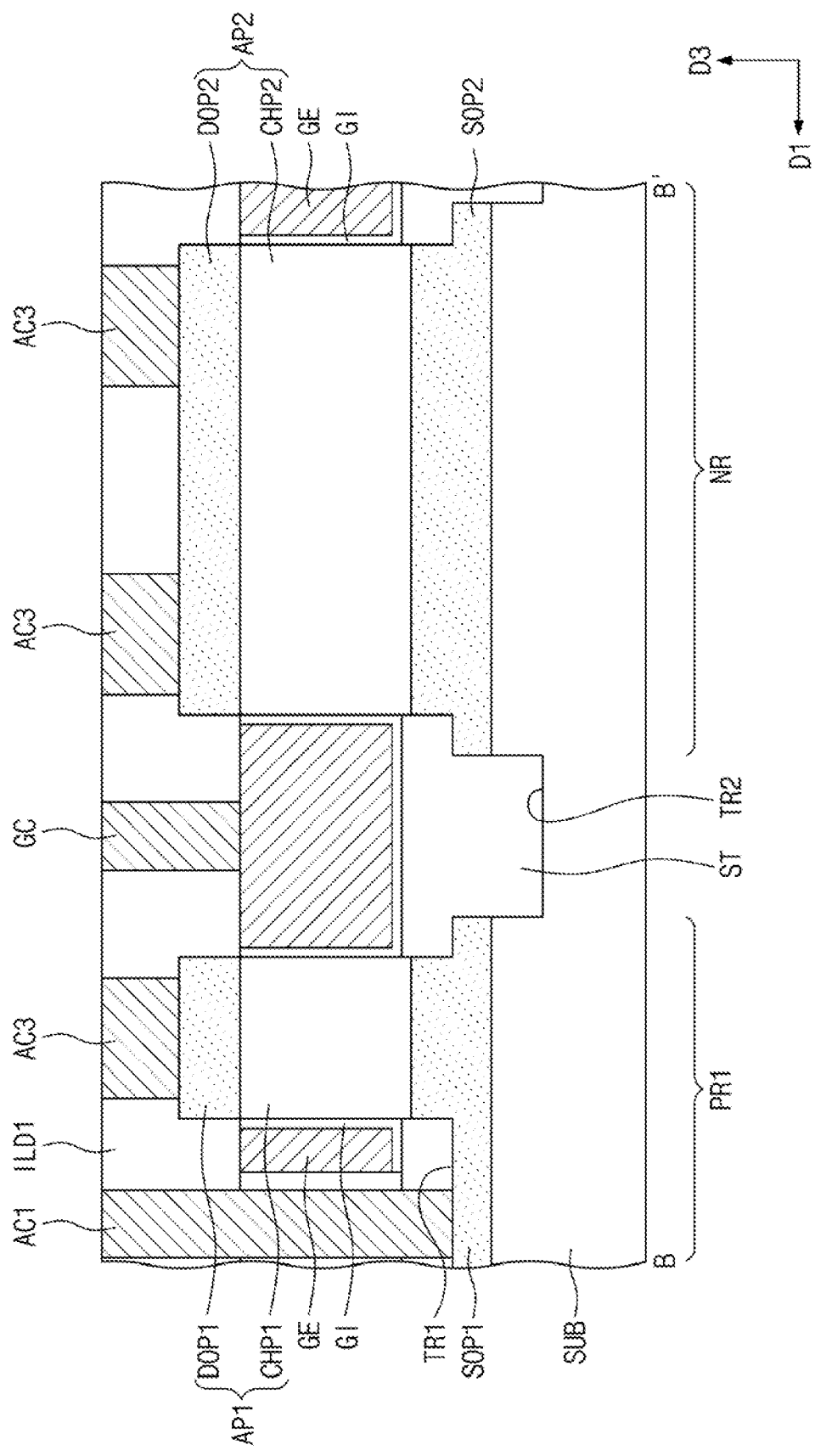

Referring to FIGS. 17, 18A, and 18B, a dielectric layer may be additionally deposited on the first interlayer dielectric layer ILD1, and therefore, the first interlayer dielectric layer ILD1 may cover the first and second drain patterns DOP1 and DOP2.

First and second active contacts AC1 and AC2 may be formed which penetrate the first interlayer dielectric layer ILD1 and are respectively coupled to the first and second source patterns SOP1 and SOP2. The formation of the first and second active contacts AC1 and AC2 may include forming first and second holes that penetrate the first interlayer dielectric layer ILD1 and respectively expose the first and second source patterns SOP1 and SOP2, and then filling the first and second holes with a conductive material.

Third active contacts AC3 may be formed which penetrate the first interlayer dielectric layer ILD1 and are coupled to the first and second drain patterns DOP1 and DOP2. Gate contacts GC may be formed which penetrate the first interlayer dielectric layer ILD1 and are coupled to the gate electrodes GE.

Referring back to FIGS. 4 and 5A to 5D, a second interlayer dielectric layer ILD2 may be formed on the first interlayer dielectric layer ILD1. A first wiring layer M1 may be formed in the second interlayer dielectric layer ILD2. The first wiring layer M1 may include first, second, and third power rails POR1, POR2, and POR3 and connection lines IL that extend parallel to each other in the second direction D2. A damascene process may be used to form the first, second, and third power rails POR1, POR2, and POR3 and the connection lines IL.

Vias VI may be formed below the first wiring layer M1. The first wiring layer M1 may be electrically connected through the vias VI to the first, second, and third active contacts AC1, AC2, and AC3 and the gate contacts GC.

Figure 19:
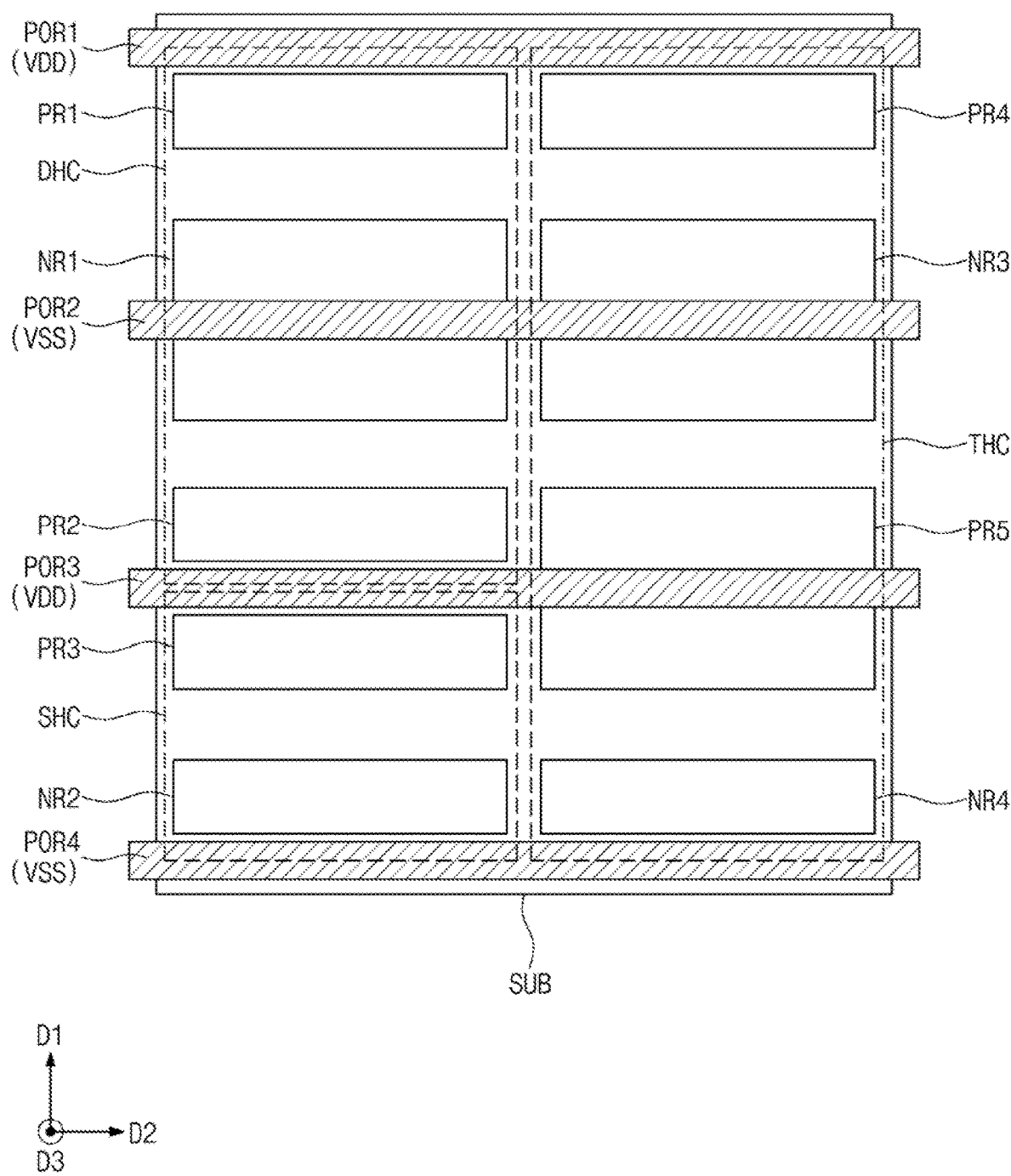
FIG. 19 illustrates a plan view showing an arrangement of logic cells of a semiconductor device according to an example embodiment.

FIG. 19 illustrates a plan view showing an arrangement of logic cells of a semiconductor device according to an example embodiment.

Referring to FIG. 19, a substrate SUB may be provided thereon with a single height cell SHC, a double height cell DHC (bottom left side and top left side of FIG. 19, respectively), and a triple height cell THC (right side of FIG. 19) that are identical or similar to those discussed above with reference to FIGS. 1, 2, and 3. The double height cell DHC may be adjacent in the first direction D1 to the single height cell SHC. The triple height cell THC may be disposed adjacent in the second direction D2 to the single height cell SHC and the double height cell DHC.

Each of the single height cell SHC, the double height cell DHC, and the triple height cell THC may include at least one PMOSFET region and at least one NMOSFET region. Each of the single height cell SHC, the double height cell DHC, and the triple height cell THC may include vertical transistors discussed above with reference to FIGS. 4 to 6B.

The double height cell DHC may be disposed between a first power rail POR1 and a third power rail POR3. A second power rail POR2 may run across the double height cell DHC. The single height cell SHC may be disposed between the third power rail POR3 and a fourth power rail POR4.

The triple height cell THC may be defined between the first power rail POR1 and the fourth power rail POR4. The second power rail POR2 and the third power rail POR3 may run across the triple height cell THC.

When viewed in plan, the third power rail POR3 may have thereunder a second PMOSFET region PR2 of the double height cell DHC, a third PMOSFET region PR3 of the single height cell SHC, and a fifth PMOSFET region PR5 of the triple height cell THC. In another implementation (not shown), the second PMOSFET region PR2 and the third PMOSFET region PR3 may be offset in the first direction D1 from the third power rail POR3, such that the second and third PMOSFET regions PR2 and PR3 are not vertically overlapped by the third power rail POR3.

A vertical transistor between the third power rail POR3 and the second and third PMOSFET regions PR2 and PR3 may have a structure substantially the same as that of the transistor discussed above with reference to FIG. 6A.

When viewed in plan, the fifth PMOSFET region PR5 may include an area that vertically overlaps the third power rail POR3. The third power rail POR3 may run across a center of the fifth PMOSFET region PR5. A vertical transistor between the fifth PMOSFET region PR5 and the third power rail POR3 may have a structure substantially the same as that of the transistor discussed above with reference to FIG. 6B.

As described above, embodiments relate to a semiconductor device including a vertical field effect transistor. Embodiments may provide a semiconductor device with improved electrical characteristics and increased integration, and a method of fabricating the same.

According to an example embodiment, a semiconductor device may be configured such that a vertical transistor is provided on a multi-height cell. The vertical transistor provided on the multi-height cell may have an active region whose area is greater than that of an active region of a vertical transistor provided on a single height cell, and accordingly, the transistor may improve in electrical performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate that includes a first active region;
a first active pattern and a second active pattern that are on the first active region, the first and second active patterns extending in a first direction and being spaced apart from each other in a second direction that intersects the first direction, and each of the first and second active patterns having a source pattern, a channel pattern, and a drain pattern that are sequentially stacked;
a first gate electrode and a second gate electrode that surround the channel patterns of the first and second active patterns and extend in the first direction;
an interlayer dielectric layer that covers the first and second active patterns and the first and second gate electrodes;
a first active contact that penetrates the interlayer dielectric layer and is coupled to the first active region between the first and second active patterns; and
a first power rail on the interlayer dielectric layer and electrically connected to the first active contact, each of the first and second active patterns including an overlapping region that vertically overlaps the first power rail.

2. The semiconductor device as claimed in claim 1, wherein each of the first and second active patterns further includes:
a first extension region that extends in the first direction from the overlapping region; and
a second extension region that extends from the overlapping region in a direction opposite to the first direction.

3. The semiconductor device as claimed in claim 1, wherein the first active contact extends in the first direction between the first and second active patterns.

4. The semiconductor device as claimed in claim 3, further comprising a second active contact the penetrates the interlayer dielectric layer and is coupled to the drain patterns of the first and second active patterns, wherein:
the second active contact extends in the second direction between the first and second active patterns, and
a bottom surface of the second active contact is higher than a bottom surface of the first active contact.

5. The semiconductor device as claimed in claim 1, further comprising a gate contact that penetrates the interlayer dielectric layer and is coupled to at least one of the first and second gate electrodes,
wherein a bottom surface of the gate contact is higher than a bottom surface of the first active contact.

6. The semiconductor device as claimed in claim 1, wherein the substrate further includes a second active region,
wherein the semiconductor device further comprises:
a third active pattern and a fourth active pattern that are on the second active region, the third and fourth active patterns extending in the first direction and being spaced apart from each other in the second direction, and each of the third and fourth active patterns having a source pattern, a channel pattern, and a drain pattern that are sequentially stacked;
a second active contact that penetrates the interlayer dielectric layer and is coupled to the second active region; and
a second power rail on the interlayer dielectric layer and electrically connected to the second active contact,
wherein, when viewed in plan, the third and fourth active patterns are offset from the second power rail.

7. The semiconductor device as claimed in claim 6, wherein:
the first active contact extends in the first direction between the first and second active patterns, and
the second active contact extends in the second direction below the second power rail.

8. The semiconductor device as claimed in claim 6, wherein:
the first gate electrode extends in the first direction from the first active pattern and surrounds the channel pattern of the third active pattern, and
the second gate electrode extends in the first direction from the second active pattern and surrounds the channel pattern of the fourth active pattern.

9. The semiconductor device as claimed in claim 6, wherein:
each of the third and fourth active patterns has a first length in the first direction,
each of the first and second active patterns has a second length in the first direction, and
the second length is two to five times the first length.

10. The semiconductor device as claimed in claim 9, wherein a width in the second direction of each of the first and second active patterns is substantially the same as a width in the second direction of each of the third and fourth active patterns.

11. A semiconductor device, comprising:
a substrate that includes a first active region;
a first active pattern and a second active pattern that are on the first active region, the first and second active patterns extending in a first direction and being spaced apart from each other in a second direction that intersects the first direction, and the first and second active patterns protruding in a vertical direction from a top surface of the substrate;
a first gate electrode and a second gate electrode that surround the first and second active patterns and extend in the first direction, upper portions of the first and second active patterns protruding in the vertical direction above top surfaces of the first and second gate electrodes;
an interlayer dielectric layer that covers the first and second active patterns and the first and second gate electrodes;
a first active contact that penetrates the interlayer dielectric layer and is coupled to the first active region between the first and second active patterns; and
a first power rail on the interlayer dielectric layer and electrically connected to the first active contact, wherein, in plan view, the first power rail runs across the first and second active patterns and extends in the second direction.

12. The semiconductor device as claimed in claim 11, wherein the first active contact extends in the first direction between the first and second active patterns.

13. The semiconductor device as claimed in claim 11, wherein the substrate further includes a second active region, wherein the semiconductor device further comprises:
a third active pattern and a fourth active pattern that are on the second active region, the third and fourth active patterns extending in the first direction and being spaced apart from each other in the second direction, and the third and fourth active patterns vertically protruding from the top surface of the substrate;
a second active contact that penetrates the interlayer dielectric layer and is coupled to the second active region; and
a second power rail on the interlayer dielectric layer and electrically connected to the second active contact, wherein, in plan view, the second power rail is offset from the third and fourth active patterns and extends in the second direction.

14. The semiconductor device as claimed in claim 13, wherein:
each of the third and fourth active patterns has a first length in the first direction,
each of the first and second active patterns has a second length in the first direction, and
the second length is two to five times the first length.

15. The semiconductor device as claimed in claim 13, wherein:
the first active region is one of a PMOSFET region and an NMOSFET region, and
the second active region is the other of the PMOSFET region and the NMOSFET region.

16. A semiconductor device, comprising:
a substrate;
a first power rail, a second power rail, and a third power rail that are arranged along a first direction on the substrate; and
a logic cell between the first power rail and the third power rail, the logic cell including:
a first active region adjacent to the first power rail, a second active region across which the second power rail runs, and a third active region adjacent to the third power rail;
first to third active patterns respectively on the first to third active regions, when viewed in plan, each of the first to third active patterns having a bar shape that extends in the first direction;
a gate electrode on the first to third active patterns; and
an interlayer dielectric layer that covers the first to third active patterns and the gate electrode, wherein:
the first to third power rails are on the interlayer dielectric layer,
each of the first to third active patterns vertically extends from the substrate and penetrates the gate electrode,
the first active pattern has a first length in the first direction,
the second active pattern has a second length in the first direction, and
the second length is two to five times the first length.

17. The semiconductor device as claimed in claim 16, wherein:
each of the first and third active regions is one of a PMOSFET region and an NMOSFET region, and
the second active region is the other of the PMOSFET region and the NMOSFET region.

18. The semiconductor device as claimed in claim 16, wherein:
the first and third power rails are connected to one of a source voltage and a drain voltage, and
the second power rail is connected to the other of the source voltage and the drain voltage.

19. The semiconductor device as claimed in claim 16, wherein widths in a second direction of the first and second active patterns are substantially the same as each other, the second direction intersecting the first direction.

20. The semiconductor device as claimed in claim 16, wherein:
the third active pattern has a third length in the first direction, and
the third length is substantially the same as the first length.

* * * * *